United States Patent
Miyajima

[11] Patent Number: 5,891,384
[45] Date of Patent: Apr. 6, 1999

[54] METHOD OF OPERATING A MOLDING MACHINE WITH RELEASE FILM

[75] Inventor: Fumio Miyajima, Nagano, Japan

[73] Assignee: Apic Yamada Corporation, Nagano, Japan

[21] Appl. No.: 561,021

[22] Filed: Nov. 21, 1995

[30] Foreign Application Priority Data

| Nov. 21, 1994 | [JP] | Japan | 6-286934 |
| Nov. 21, 1994 | [JP] | Japan | 6-286937 |
| Nov. 21, 1994 | [JP] | Japan | 6-286944 |
| Nov. 29, 1994 | [JP] | Japan | 6-294762 |
| Feb. 20, 1995 | [JP] | Japan | 7-030353 |

[51] Int. Cl.$^6$ .......................... B29C 33/18; B29C 33/68; B29C 45/02
[52] U.S. Cl. .............. 264/511; 264/272.14; 264/272.17; 264/276; 425/544; 425/546; 425/116
[58] Field of Search ........................ 264/272.11, 272.15, 264/272.17, 328.4, 328.5, 276, 264, 511, 328.9, 338, 513; 425/116, 121, 117, 544, 543, 546

[56] References Cited

U.S. PATENT DOCUMENTS

| H1654 | 6/1997 | Rounds | 264/511 |
| 3,754,070 | 8/1973 | Dunn et al. | 264/272.17 |
| 4,003,544 | 1/1977 | Bliven et al. | 425/121 |
| 4,052,241 | 10/1977 | Walter | 264/278 |
| 4,944,908 | 7/1990 | Leveque et al. | 264/278 |
| 4,956,141 | 9/1990 | Allen et al. | 264/328.6 |
| 4,965,037 | 10/1990 | Weaver et al. | 264/511 |
| 5,043,199 | 8/1991 | Kubota et al. | 264/328.5 |
| 5,098,626 | 3/1992 | Pas | 264/328.5 |
| 5,151,276 | 9/1992 | Sato et al. | 264/272.17 |
| 5,185,653 | 2/1993 | Switky et al. | 257/729 |
| 5,226,997 | 7/1993 | Vallier | 156/245 |
| 5,270,262 | 12/1993 | Switky et al. | 437/217 |
| 5,401,457 | 3/1995 | Valyi | 264/513 |
| 5,417,905 | 5/1995 | Lemaire et al. | 264/266 |
| 5,431,854 | 7/1995 | Pas | 264/328.9 |

FOREIGN PATENT DOCUMENTS

| 0 350 179 | 1/1990 | European Pat. Off. . |
| 0665584 | 8/1995 | European Pat. Off. . |
| 665584A1 | 8/1995 | European Pat. Off. . |
| 52-43366 | 5/1977 | Japan . |
| 61-4234 | 6/1984 | Japan . |
| 64-44026 | 2/1989 | Japan . |
| 1-293523 | 11/1989 | Japan | 425/544 |
| 1-299008 | 12/1989 | Japan | 425/117 |
| 4-37507 | 2/1992 | Japan . |

OTHER PUBLICATIONS

Semiconductor Packaging Update, "The 3P Process: Reengineering the Semiconductor Packaging/Assembly Workplace", pp. 2–12, 1994, vol. 9, No. 6, Editor & Publisher: Dr. Subash Khadpe.

*Primary Examiner*—Angela Ortiz
*Attorney, Agent, or Firm*—Birch, Stewart, Kolasch & Birch, LLP

[57] ABSTRACT

An object of the present invention is to provide a resin molding machine having molding dies, which have simple structures and which can be easily made. Another object is to provide a method of resin molding using release film, which is capable of employing various materials as a material for the molding dies. In the resin molding machine of the present invention, molding dies have molding sections including cavities, and the molding dies are capable of clamping a member to be molded. A pot pressurizes and sends resin melt to the cavities. A fixing mechanism fixes release film, which is capable of easily peeling off from the molding dies and resin for molding, on inner faces of the molding sections and clamping faces, and the fixing mechanism fixes the release film by sucking air.

20 Claims, 18 Drawing Sheets

METHOD OF OPERATING A MOLDING MACHINE WITH RELEASE FILM

BACKGROUND OF THE INVENTION

The present invention relates to a resin molding machine, a method of resin molding and a release film for the machine and the method.

A conventional transfer molding machine is shown in FIG. 44. In the conventional machine, a member to be molded is clamped by an upper die 10a and a lower die 10b, then resin is filled into cavities to mold the member to be molded. The resin, sent from a pot 12, directly contacts inner faces of molding sections of the dies 10a and 10b, a runner and a gate, so the dies 10a and 10b must have enough abrasion-proof ability and durability. The molding dies 10a and 10b are usually made of steel and heat treated.

In the conventional molding machine, solidified resin is stuck in the molding sections, etc., so there are provided ejector pins in the molding dies. To remove the solidified resin on the molding dies, a cleaning step is required for each molding work.

Generally, thermosetting resin, e.g., epoxy resin, phenolic resin, is used. Thus, the molding dies must be heated to a prescribed temperature, so there are heaters in base sections of the molding dies. In the conventional molding machine, the resin directly contacts the molding dies as described above, heat can be directly exchanged between the resin and the dies, so that resin solidification can be accelerated and the molding cycle time can be shortened.

However, the molding dies must have prescribed durability, so it is difficult to machine a hard material so as to make the dies. Furthermore, the ejector pins must be assembled in the dies, so the dies must have a complex structure. Due to the hard material and the complex structure, it is difficult to make the molding dies.

SUMMARY OF THE INVENTION

An object of the present invention is to provide a resin molding machine having molding dies, which have simple structures and which can be easily made.

Another object of the present invention is to provide a method of resin molding using release film, which is capable of employing various materials as a material for the molding dies, and the release film for the method and the machine.

To achieve the objects, the resin molding method of the present invention comprises the steps of:

providing an insert member to be molded upon, a release film, a first die with a first clamping face and a first molding cavity for accepting resin, and a second die with a second clamping face;

providing at least one first opening in the first clamping face and at least one second opening in the first molding cavity, providing an air sucking mechanism, and a plurality of air paths connecting the air sucking mechanism to the at least one first opening and the at least one second opening;

operating the air sucking mechanism;

communicating the air sucking mechanism to the at least one first opening to vacuum the release film against the first clamping face;

subsequently, communicating the air sucking mechanism to the at least one second opening to vacuum the release film into the first molding cavity;

clamping the insert member to be molded upon between the first clamping face and the second clamping face;

delivering fluidized resin into the first molding cavity; and molding upon a portion of the insert member adjacent to the first molding cavity to form the semiconductor device.

Also, according to the present invention, a method of forming a semiconductor device by resin molding comprises the steps of:

providing a first die having a first clamping face and a first molding cavity; a second die having a second clamping face and a second molding cavity; a pot; a resin path connecting the pot to the first and second molding cavities; an insert member to be molded upon; a first release film; a second release film; an air sucking mechanism; a first plurality of openings formed in the first and second clamping faces; a second plurality of openings formed in the first and second molding cavities; and air sucking paths extending from the air sucking mechanism to the first and second pluralities of openings;

dispensing the first release film onto the first die and dispensing the second release film onto the second die;

operating the air sucking mechanism;

communicating the air sucking mechanism to the first plurality of openings to vacuum the first and second release films against the first and second clamping faces, respectively;

subsequently, communicating the air sucking mechanism to the second plurality of openings to vacuum the first and second release films into the first and second molding cavities, respectively;

clamping the insert member to be molded upon between the first clamping face and the second clamping face;

delivering fluidized resin from the pot, via the resin path, into the first and second molding cavities; and molding upon portions of the insert member adjacent to the first and second molding cavities to form the semiconductor device.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Embodiments of the present invention will now be described by way of examples and with reference to the accompanying drawings, in which.

DETAILED DESCRIPTION OF THE PREFERRED EMBODIMENTS

Preferred embodiments of the present invention will now be described in detail with reference to the accompanying drawings.

Figure 1:
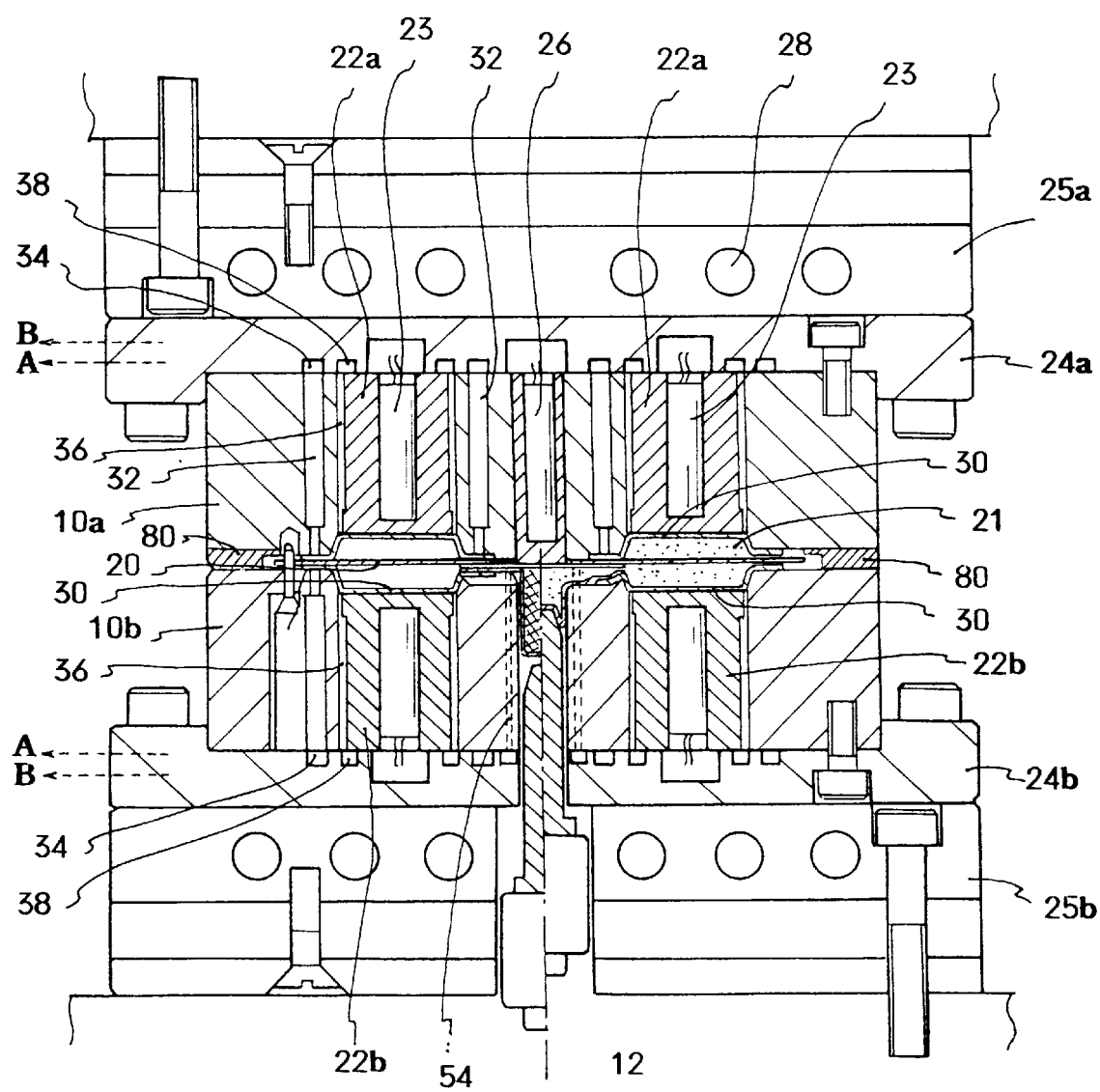
FIG. 1 is a sectional view of a resin molding machine of First Embodiment.

FIG. 1 shows a resin molding machine using release film, according to the first embodiment. In FIG. 1, the left side of the center line shows a state of clamping a lead frame 20, which is a member to be molded; the right side thereof shows a state of filling resin into a cavity 21.

An upper die 10a and a lower die 10b have cavities. In the present embodiment, bottoms of the cavities are formed by fitting cavity pieces 22a and 22b in the dies 10a and 10b. Base sections of the dies 10a and 10b are made of steel; the cavity pieces 22a and 22b are made of a material having high heat conductivity, e.g., copper, aluminum. The cavity pieces 22a and 22b, of course, may be made of steel.

Figure 2:
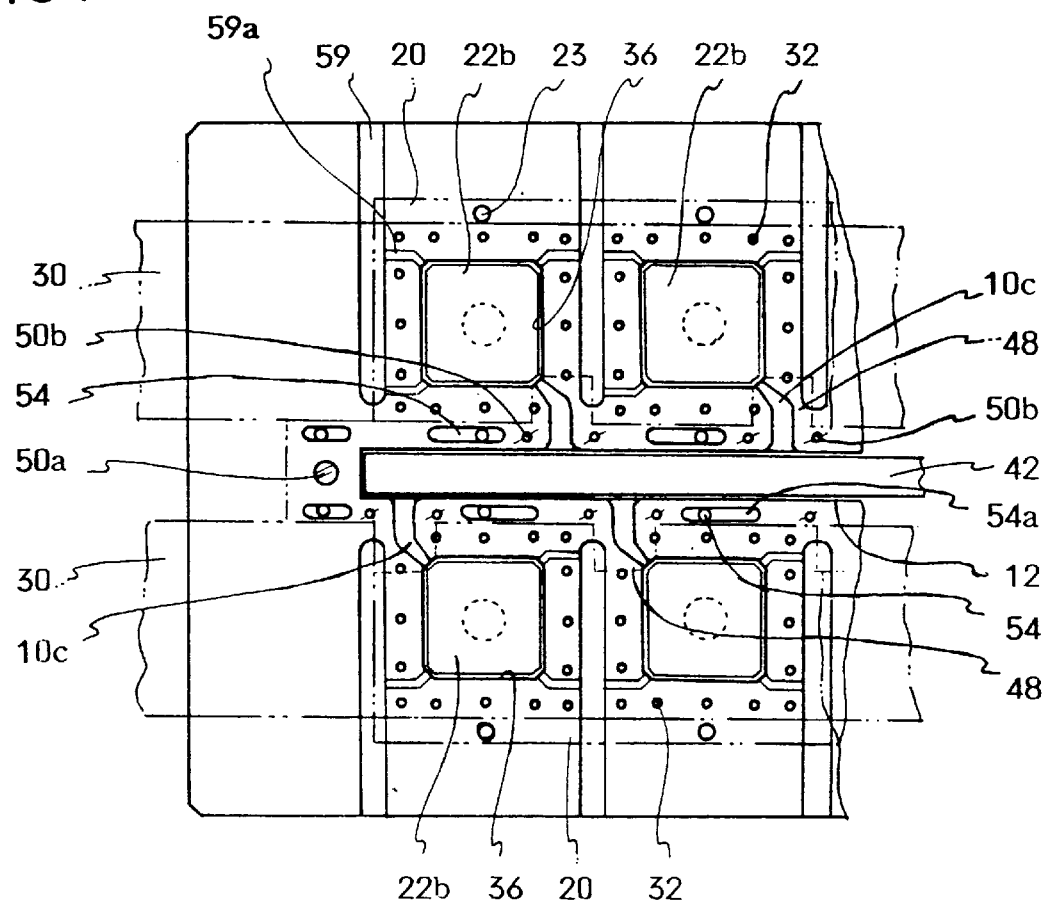
FIG. 2 is an explanation view showing planar arrangement of cavity pieces of a molding die, release film, etc.

FIG. 2 shows arrangement of the cavity pieces 22b in the lower die 10b. The cavity pieces 22b are formed like blocks. Through-holes for fitting the cavity pieces 22a and 22b are bored in the base sections of the molding dies 10a and 10b. The cavity pieces 22a and 22b are respectively inserted in the through-holes, and they are fixed to plates 24a and 24b by screws.

There is provided a cull piece 26 in the upper die 10a. The cull piece 26 is made of a material different from the base section of the upper die 10a. The cull piece 26 is positioned to face a pot 12. The cull piece 26 is fixed to the plate 24a. The cull piece 26 too may be made of the material having high heat conductivity, e.g., copper, aluminum.

Since the cavity pieces 22a and 22b and the cull piece 26 are made of the material having high heat conductivity, heat exchange between resin filled in the cavities and the molding dies 10a and 10b can be effectively executed, so that resin solidification can be accelerated.

To heat the dies 10a and 10b, the dies 10a and 10b are fixed to the plate 24a and 24b together with heat blocks 25a and 25b in which heaters 28 are provided. In the present embodiment, heaters 23 are further provided in the cavity pieces 22a and 22b and the cull piece 26. With this structure, the cavity pieces 22a and 22b and the cull piece 26 can be heated effectively. Thermosensors, e.g., thermocouples, thermostats, are provided to the heaters or the pieces 22a, 22b and 26.

Generally, copper and aluminun cannot be used for the molding dies. But, by using release film, they can be used for the molding dies other than the base sections. In the method of resin molding using the release film, parts of the molding dies in which resin directly contacts the molding dies are covered with the release film to prevent the resin from contacting the molding dies.

In the present embodiment, the resin molding is executed by the steps of: feeding a sheet of the release film onto parting faces of the dies 10a and 10b so as to cover molding sections of the dies 10a and 10b; setting a member to be molded on the die 10b; clamping the member to be molded by the dies 10a and 10b; and filling the resin melt into the cavities to mold. After molding, the molded product is taken out independently or together with the release film by a proper mechanism.

The release film is required to resist a molding temperature of the dies. And it is also required to be easily peeled off from the dies and the molded products. Thus, FEP sheet film, glass cloth in which fluoric resin is impregnated, PET sheet film, ETFE sheet film, polyvinylidene chloride, etc. can be employed as the release film.

In the left side of FIG. 1, a lead frame 20, which is the member to be molded, is clamped by the upper die 10a and the lower die 10b.

Generally, in the molding method using the release film, the release film is set for each molding work. A method of setting the release film 30 of the present embodiment will be explained.

A sheet of the release film 30 is formed into a belt shape which has prescribed width for covering over the molding sections of the dies 10a and 10b. The release film 30 is sucked to fix on clamping faces, which are peripheral faces of the molding sections, of the dies. The release film 30 is formed not to interfere with guide pins 23, which locate the lead frame 20 at a prescribed position on the die 10b.

Sucking air paths 32 are arranged in an area covered with the release film 30, and they enclose edges of the cavities. When air is sucked through the sucking air paths 32, the release film 30 is sucked against the clamping faces. The sucking force to fix the release film 30 is made greater when a diameter of the opening sections of the sucking air paths 32 is greater. The release film 30 is softened by the heat of the molding dies. Thus, the release film 30 is caught by sharp edges of the sucking air paths 32 when the release film 30 is sucked by the paths 32, so that the release film 30 is not drawn toward the cavities even if the release film 30 is sucked in the cavities.

As shown in FIG. 1, the sucking air paths 32 are communicated with air paths 34, which are formed in the plates 24a and 24b. The air paths 34 are communicated with an external air sucking mechanism A. The release film 30 is sucked by air suction of the air sucking mechanism A.

The release film 30 is fixed along inner faces of the molding sections, e.g., the cavities, by the air suction. This sucking fixation is executed by sucking air through edges of the bottoms of the cavities. There are small gaps between the cavity pieces 22b and 22b and the through-holes of the dies in which the pieces 22a and 22b have been inserted. The gaps are cavity air paths 36 for drawing the release film 30 by the air suction. As shown in FIG. 1, the cavity air paths 36 communicated with air paths 38, which are formed in the plates 24a and 24b. The air paths 38 are communicated with an external air sucking mechanism B. Note that, a width of one end of the cavity air paths 36, which are opened along the edges of the bottoms of the cavities, are made narrower so as to suck the release film 30 effectively.

As shown in FIG. 2, the one ends of the cavity air paths 36 are opened to enclose the bottoms of the cavities. The width of the one ends of the cavity air paths 36 is designed so that the release film 30 is not drawn into the paths 36 when the release film 30 is drawn by the air suction, and so that the release film 30 is not pushed into the paths 36 by resin pressure when the resin melt is filled into the cavities.

After the release film 30 is fixed on the clamping faces of the molding dies by the suction through the sucking air paths 32, the release film 30 is drawn toward the cavity air paths 36. Then, the release film 30, which has been clamped by the clamping faces, is tightly fitted on the inner faces of the cavities. The release film 30 is made from a material, which is capable of extending by the air suction through the cavity air paths 36 and deforming along the inner shape of the cavities to fit on the inner faces thereof.

A fixing mechanism for fixing the release film 30 on the dies comprises the sucking air paths 32, the cavity air paths 36, and the external air sucking mechanisms A and B.

Air vents 59 are shown in FIG. 2. The air vents 59 are connected with corners of the cavities via sub-air vents 59a. The air vents 59 are extended until end faces of the molding die. Since the lead frames 20 are clamped together with the release film 30, they do not directly contact the molding dies. But air ventilation can be executed via the sub-air vents 59a and the air vents 59 in spite of the existence of the release film 30. The air vents 59 are provided between adjacent cavities, and they act as a means for accommodating the lead frames 20, so that the lead frames 20 can be securely clamped in the vicinity of the cavities.

In the present embodiment, since the inner faces of the cavities are covered with the release film 30, the resin does not directly contact faces of the molding sections. Further, wrapped resin 42 is supplied into the pot 12 so as to prevent the resin from directly contacting inner faces of resin paths, which connect the cull piece 26, the pot 12 and the cavities 21.

Figure 3:
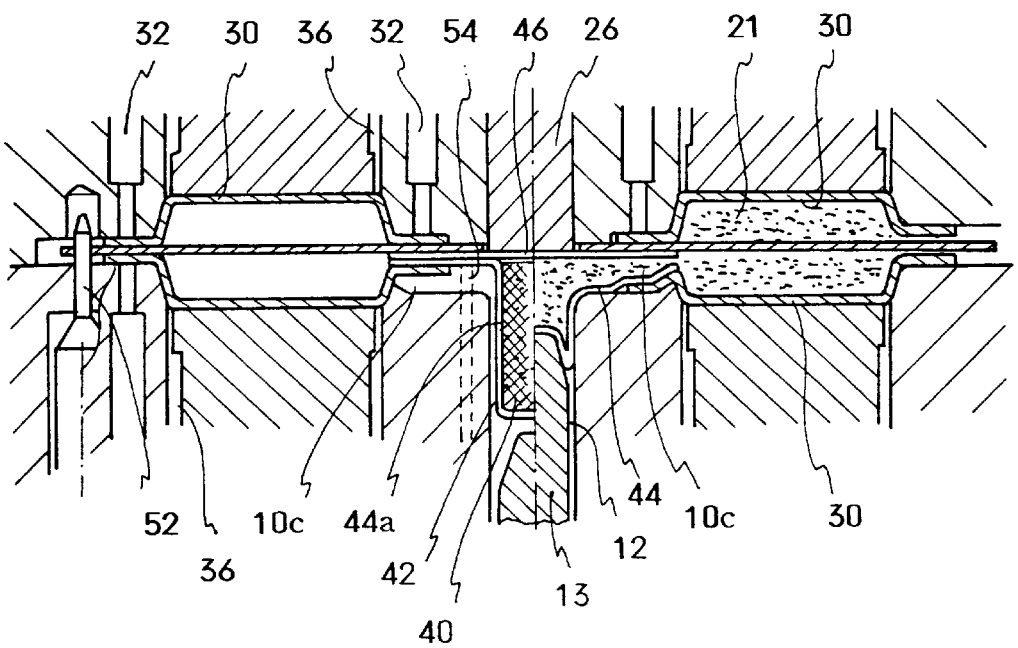
FIG. 3 is an explanation view showing arrangement of wrapped resin, a member to be molded and the release film.

FIG. 3 shows a state of setting the wrapped resin 42 in the pot 12. The resin 40 is tightly wrapped between a lower wrapping film 44, which has a pocket section 44a in which the resin 40 is accommodated, and an upper wrapping film 46. The lower wrapping film 44 and the upper wrapping film 46 are mutually adhered. Epoxy resin and phenolic resin, for example, can be used as the thermosetting resin 40. The wrapped resin 42 is preferably formed by extruding a resin material so as to prevent air mixture.

A planar arrangement of the pot 12 and the wrapped resin 42 is shown in FIG. 2. In the present embodiment, the narrow rectangular pot 12 is arranged between the lead frames 20, which are located in parallel. Resin paths and gates 10c are extended from the pot 12 to each molding section. The resin 40 in the wrapped resin 42 is formed into a thin stick shape to correspond to an inner shape of the pot 12. Heat exchanging efficiency of the stick resin 40 is greater than that of conventional resin formed into a columnar shape. The resin which has a sectional shape of an oblong shape has greater heat efficiency than the resin which has a sectional shape of a regular square shape. An end section of a plunger in the pot 12 is formed thin to correspond to the inner shape of the pot 12.

Figure 4:
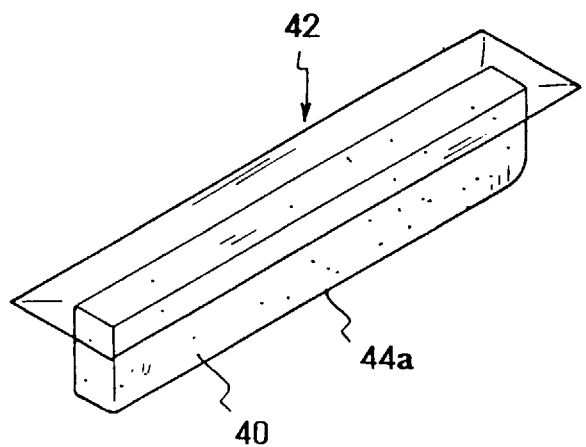
FIG. 4 is a perspective view of the wrapped resin.

The wrapped resin 42, which is generally used, is shown in FIG. 4. Overlapped sections of the lower film 44 and the upper film 46 are tightly heat-sealed. The sealed sections are peeled off from the pot 12 by resin pressure for sending.

The lower film 44 and the upper film 46 have extended sections 48, which are extended from side edges of the films 44 and 46, to prevent sticking of the resin to the resin paths. To prevent the resin from sticking on the dies, the extended sections 48 are extended to overlap the release film 30, which is sucked to against the dies 10a and 10b.

When the extended sections 48 are extended to coincide with ends of the gates 10c, the lead frames 20 can be molded while avoiding any sticking of the resin on the lead frames 20. By avoiding stuck resin on the lead frames 20, a step of breaking gates is not required, so that deformation of the molded lead frames can be prevented.

To precisely coincide the extended sections 48 with the ends of the gates 10c, pilot pins 50a and 50b are inserted through pilot holes, which have been bored in the wrapping films. The pilot pin 50a is located near one end of the wrapped resin 42; the pilot pins 50b are located at base sections of the extended section 48.

Figure 5:
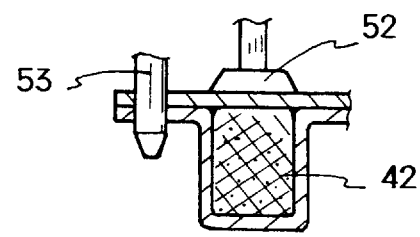
FIG. 5 is an explanation view showing a method of setting the wrapping resin into the molding die by a jig.
Figure 5:
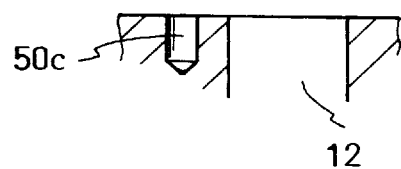

The wrapped resin 42 may be set with a jig for setting into the pot 12 instead of the pilot pins 50a and 50b. As shown in FIG. 5, the wrapped resin 42 is sucked by a sucking pad 52 of the setting jig. The wrapped resin 42 is precisely positioned by a positioning pin 53. There is bored a positioning hole 50c into which the positioning pin 53 is inserted in the molding die. With this structure, the extended sections 48 can be coincided with the gates 10c when the wrapped resin 42 is set in the pot 12 with the setting jig. In the case of boring the pilot hole 50c in the molding die, setting and positioning the lead frames 20 are easier than the case of providing the pilot pins 50a and 50b.

Figure 6:
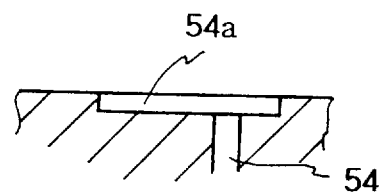
FIG. 6 is an explanation view showing a sucking hole in a lower die.

To prevent the edges of the wrapping film from turning over and to securely hold the same when the wrapped resin 42 is set into the pot 12, there is bored sucking holes 54 in the lower die 10b. As shown in FIG. 2, the sucking holes 54 are bored along the edges of the wrapping film at prescribed intervals. The sucking holes 54 are opened in bottom faces of female cone sections 54a respectively (see FIG. 6). The female cone sections 54a make a sucking area to securely suck the films. The female cone sections 54a are arranged parallel to the edges of the wrapping films. The sucking holes 54 are also communicated with the air paths in the plate 24b and the external air sucking mechanism.

Figure 7:
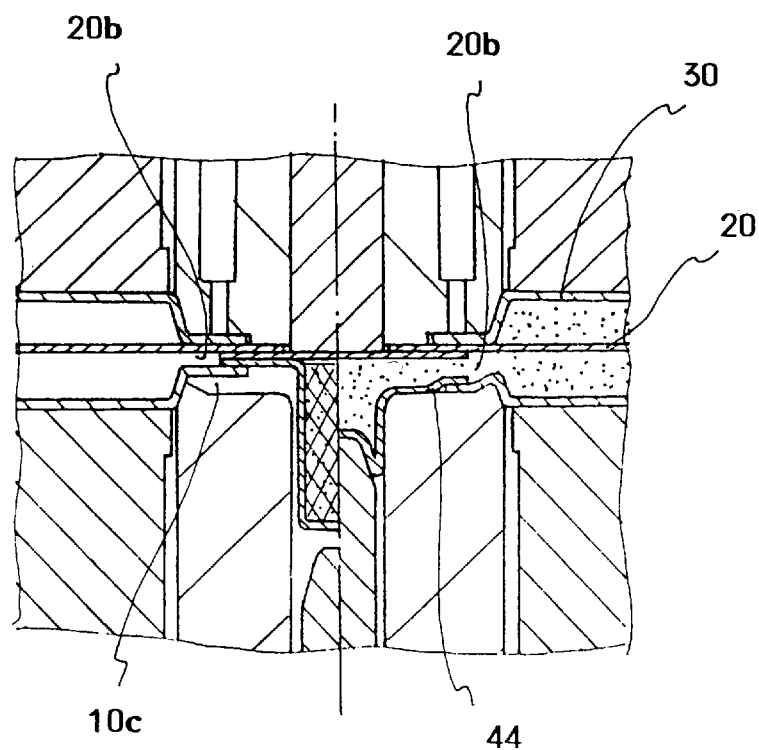
FIG. 7 is a sectional view showing a state of sticking resin onto a lead frame.

Note that, another method a in which the resin is slightly stuck on the lead frames 20 and the wrapped resin 42 is not so accurately positioned, may be actually employed. In FIG. 7, the resin is stuck on a part 20b of the lead frame 20. Length of sticking the resin is designed that the resin solidified on the lead frame 20 is not easily peeled off from the lead frame 20 while a handling step after molding.

As shown in FIG. 3, the resin melt is filled in the cavity 21 via a gap between the lower wrapping film 44 and the upper wrapping film 46. In the present embodiment, the gates 10c are provided in the lower die 10b, so the wrapping films 44 and 46 are provided between the lead frames 20 and the release film 30, which has been fixed on the lower die 10b.

In the right side of FIG. 3, the resin is filled in the cavity 21 via the gate 10c. The resin, which is pressurized and sent from the pot 12, enlarges the gap between the lower film 44 and the upper film 46 in the gate 10c, then flows into the cavity 21. The resin sent from the pot 12 is prevented from contacting the cull piece 26 by the upper wrapping film 46.

The resin 40 is pushed out from the pot 12 by the plunger 13 together with the wrapping film, which has tightly wrapped the resin 40, so that no resin is stuck on an inner face of the pot 12 and the plunger 13.

In the case of setting the wrapped resin 42 into the pot 12, no resin leak occurs therein, so that the plunger 13 need not to be precisely fitted in the pot 12. Thus, the pot 12 may be formed by boring a mere rectangular hole or circular hole in a die material. Further, since no bushing is required in the pot 12, the resin paths can be arranged close to the pot 12, so that the die can be small in size. If the pot 12 and the plunger 13 are made of materials having high heat conductivity, e.g., copper, aluminum, heat exchange between the resin and them can be accelerated, so that the resin 40 will melt in a short time.

Figure 8:
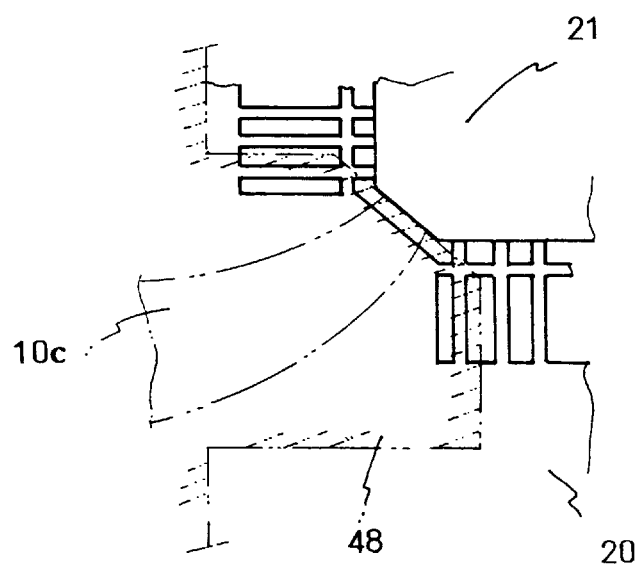
FIG. 8 is an explanation view showing arrangement of wrapping film having an extended section.

The wrapped resin 42 has the extended sections 48, which are extended from the films 44 and 46 to coincide with the gates 10c. An enlarged view of the extended section 48 is shown in FIG. 8. The extended section 48 is coincided with a connecting section of the cavity 21 and the gate 10c.

Figure 9:
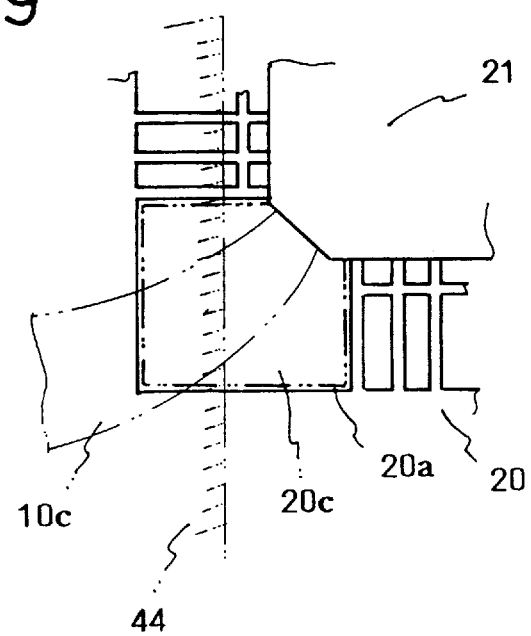
FIG. 9 is an explanation view showing arrangement of wrapping film having no extended section.

On the other hand, the wrapping films 44 and 46 shown in FIG. 9 have no extended sections. Side edges of the films 44 and 46 are linearly formed and located in the vicinity of the cavity 21. The gate 10c passes the side edge of the film 44 and reaches the cavity 21. The lead frame 20 has a vacant gate window 20a, to which the gate 10c corresponds; the molding die has a dam block 20c whose shape is corresponded to the gate window 20c and whose thickness is equal to that of the lead frame 20. Since the release film 30 covers over the dam block 20c and the cavity 21 while molding, the resin is filled into the cavity 21 without contacting the lead frame 20 even if the wrapping films 44 and 46 do not reach the connected section of the gate 10c and the cavity 21. The resin flows in the resin path, which is covered with the release film 30.

As described above, the resin can be prevented from sticking on the lead frame 20 without the extended sections 48. In the case of employing the extended sections 48, the wrapped resin 42 for exclusive use must be prepared; in the case of employing no extended sections 48, the wrapped resin 42 for wide use can be used.

Figure 10:
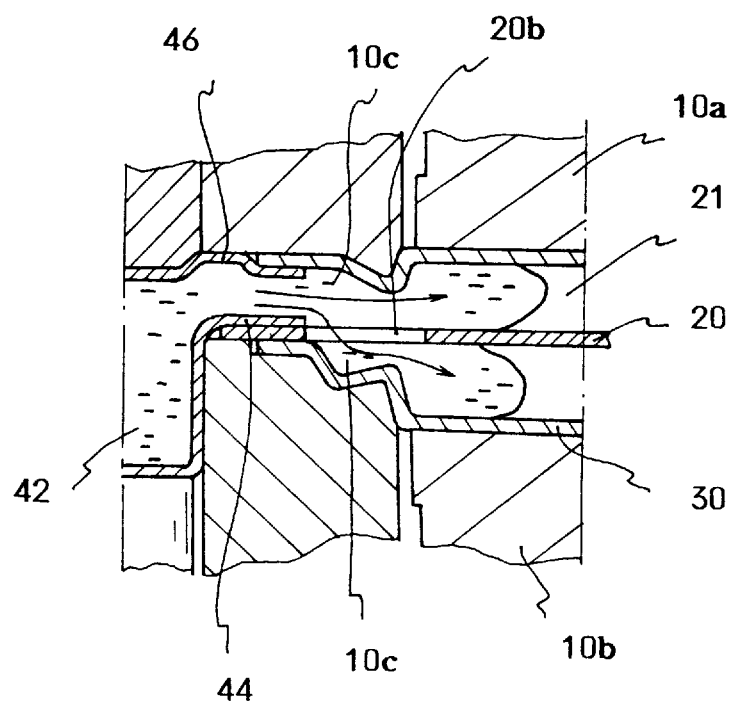
FIG. 10 is a sectional view an upper die and a lower die having gates respectively.

In the case of the lead frame 20 having the gate window 20a (see FIG. 9), the resin can be filled via the gates 10c, which are formed in the upper die 10a and the lower die 10b, as shown in FIG. 10. By providing the gates 10c in the dies 10a and 10b to correspond to the gate window 20a, the resin flow is branched by the gate window 20a, so that the resin is filled into the cavity from the upper gate 10c and the lower gate 10c.

As described above, in the present embodiment, the molding sections of the molding dies are covered with the release film 30, and the wrapped resin 42 is supplied. Thus, no resin directly contacts the molding dies while molding.

The release film 30 will be newly drawn in the longitudinal direction for each molding work, so that new release film 30 can be set on the dies for each cycle.

In the present embodiment, the molding sections have the cavity pieces 22a and 22b so as to form the cavity air paths 36 for fixing the release film 30 along the inner shapes of the molding sections. By selecting the shapes and the sizes of the cavity pieces 22a and 22b, the shapes and the sizes of the cavity air paths 36 can be optionally formed.

Plan views and sectional views of the cavities having the cavity pieces 22 of other examples are shown in FIGS. 11A–15B.

Figure 11A:
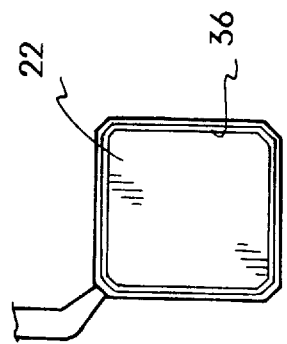
FIG. 11A is a plan view showing a state of assembling the cavity piece.
Figure 11B:
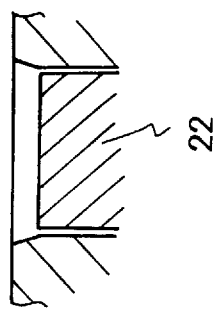
FIG. 11B is a sectional view showing a state of assembling the cavity piece.

In FIGS. 11A and 11B, the shape of the opening section of the cavity air path 36 is the same as the above described one. The cavity air path 36 is opened along connected sections of the inner bottom face of the cavity and inner side faces thereof. The cavity air path 36 encloses the inner bottom face of the cavity.

Figure 12A:
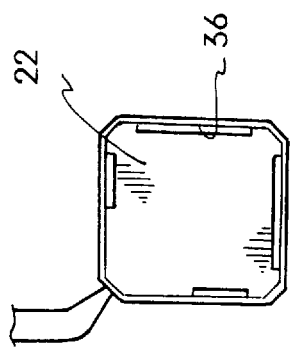
FIG. 12A is a plan view showing a state of assembling the cavity piece.
Figure 12B:
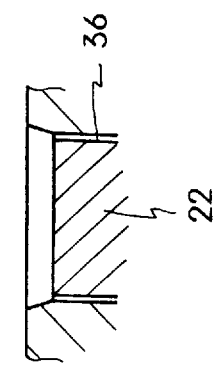
FIG. 12B is a sectional view showing a state of assembling the cavity piece.

In FIGS. 12A and 12B, the cavity air paths 36 is opened only in the inner bottom face of the cavity; no cavity air paths 36 is opened in any inner side faces thereof. The cavity air path 36 is partially opened at four positions in the bottom face. In this case, cut sections are formed on outer side faces of the cavity piece 22.

Figure 13A:
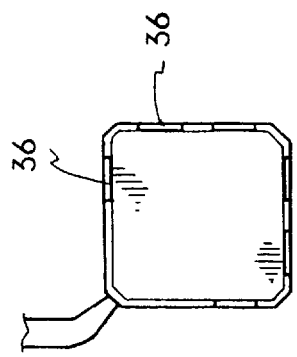
FIG. 13A is a plan view showing a state of assembling the cavity piece.
Figure 13B:
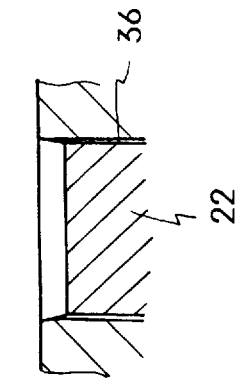
FIG. 13B is a sectional view showing a state of assembling the cavity piece.
Figure 14:
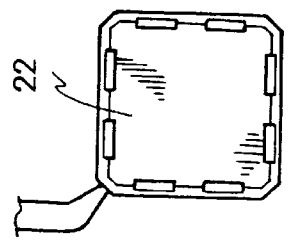
FIG. 14A is a plan view showing a state of assembling the cavity piece.
FIG. 14B is a sectonal view showing a state of assembling the cavity piece.
Figure 14:
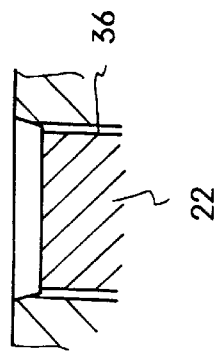
Figure 15:
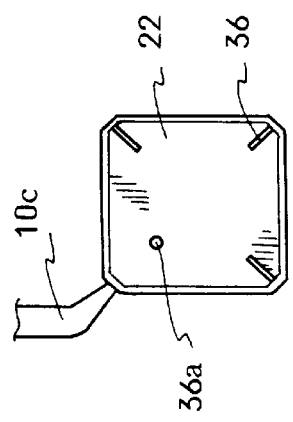
FIG. 15A is a plan view showing a state of assembling the cavity piece.
FIG. 15B is a sectional view showing a state of assembling the cavity piece.
Figure 15:
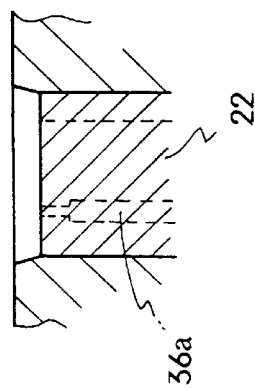

In FIGS. 13A and 13B, the cavity air paths 36 is opened in the inner side faces of the cavity. In this case, outer side faces of the cavity piece 22 are formed flat; the cut sections are partially formed on inner side faces of the through-hole of the molding die.

In FIGS. 14A and 14B, the cavity air paths 36 is opened both in the inner bottom face and the inner side faces of the cavity. In this case, the cut sections are partially formed both on the outer side faces of the cavity piece 22 and on the inner side faces of the through-hole of the molding die.

In FIGS. 15A and 15B, the cavity air paths 36 is diagonally opened like slits from corners of the inner bottom face of the cavity, which are not connected with the gate 10c. Further, the cavity air path 36 is opened like a circular hole at position 36a, which is slightly separated away from a corner of the inner bottom face of the cavity to which the gate 10c is connected toward the center of the bottom face.

As shown in FIGS. 12A, 12B, 13A, 13B, 15A and 15B, the opening sections of the cavity air paths 36 are arranged to separate away from the corner of each inner bottom face of the cavity to which the gate 10c is connected. Considering the resin flow in the cavities, the opening sections of the cavity air paths 36 are arranged as described above so as to properly fill the resin in the cavities.

Figure 16:
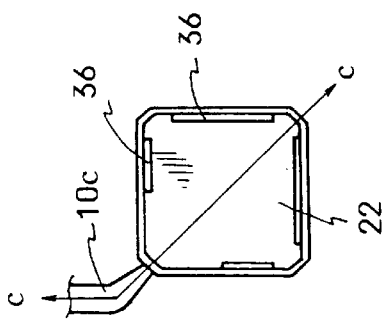
FIG. 16A is a plan view showing a molding die in which one end of a cavity air path is opened at a position separate away from one corner of the cavity, at which a gate is connected.
FIG. 16b is a sectional view showing a molding die in which one end of a cavity air path is opened at a position separate away from one corner of the cavity, at which a gate is connected.
Figure 16:
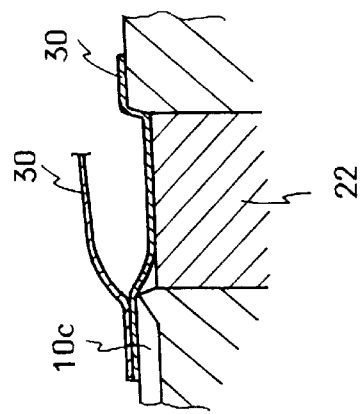

In FIGS. 16A and 16B, the cavity air path 36 is also provided to separate away from the gate 10c. Note that, FIG. 16B is a sectional view taken along the line C—C. When the release film 30 is sucked by the air path 36, the release film 30 is slightly raised like a shallow slope in the vicinity of an inner end of the gate 10c. The conventional molding machines have a problem of air mixture at a position immediately below the inner end of the gate 10c. But, by forming the shallow slope of the release film 30, a steep slope, which causes the air mixture, is removed at the position immediately below the inner end of the gate 10c, so that the air mixture can be prevented while molding. By preventing the air mixture, high quality molded products, which have no voids in the molded sections, can be produced.

Figure 17A:
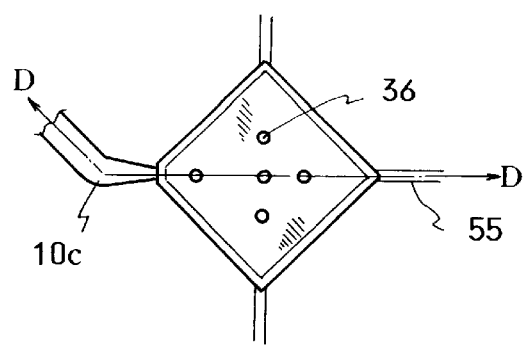
FIG. 17A is a plan view showing a molding die in which one end of a cavity air path is opened at a center of the cavity, wherein the release film is sucked.
Figure 17B:
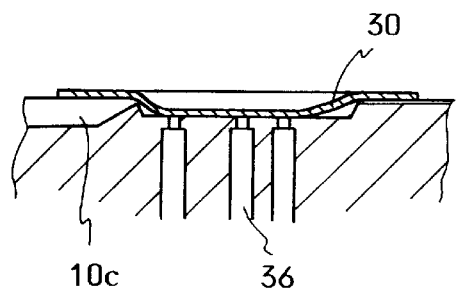
FIG. 17B is a sectional view showing a molding die in which one end of a cavity air path is opened at a center of the cavity, wherein the release film is sucked.

In FIGS. 17A and 17B, another example of the cavity air path 36 whose opening sections are also separated away from the gate 10c is shown. The opening sections of the cavity air path 36 are opened in the center area of the bottom face thereof. The release film 30 is not sucked in the vicinity of the edges of the bottom face. By sucking the release film 30 only in the center area of the cavity, the release film 30 is raised in the vicinity of the edges of the cavity, so that the resin melt is able to smoothly flow in the center area thereof, and air mixture in the center area can be prevented. Note that, air vents 55 are formed in the die.

Figure 18A:
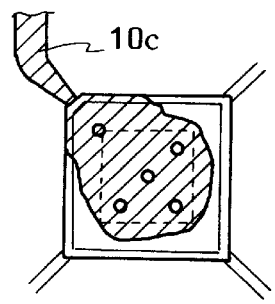
FIG. 18A is a plan view showing a state of filling resin into the cavity.
Figure 18B:
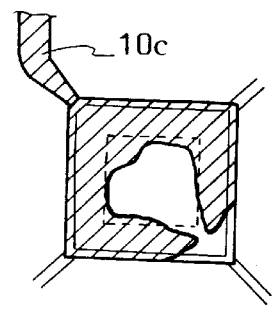
FIG. 18B is a plan view showing a state of filling resin into the cavity of the conventional machine.

In the case of providing the opening sections of the air path 36 in the center area of the cavity, a state of filling the resin is shown in FIG. 18A; in the conventional molding machine, a state of filling the resin is shown in FIG. 18B. When the lead frames are molded, a semiconductor chip is located at the center of the cavity, so the resin flow in the center area thereof is restricted by the chip in the conventional molding machine. At the beginning the resin flows in the vicinity of the chip, so that air is shut in the center area (see FIG. 18B). On the other hand, in the example shown in FIG. 18A, firstly the resin fills the center area, then the resin fills around the chip. Thus, air is pushed outward, so that high quality molding can be executed.

Figure 20:
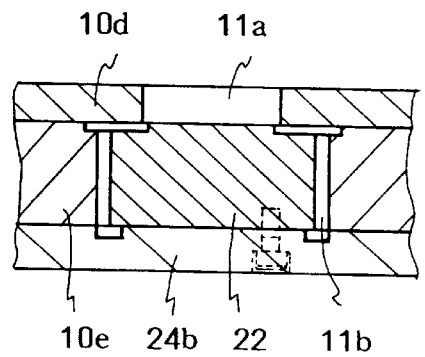
FIG. 20 is an sectional view showing a method of assembling the cavity piece.
Figures 19A, 19B, 21A, 21B:
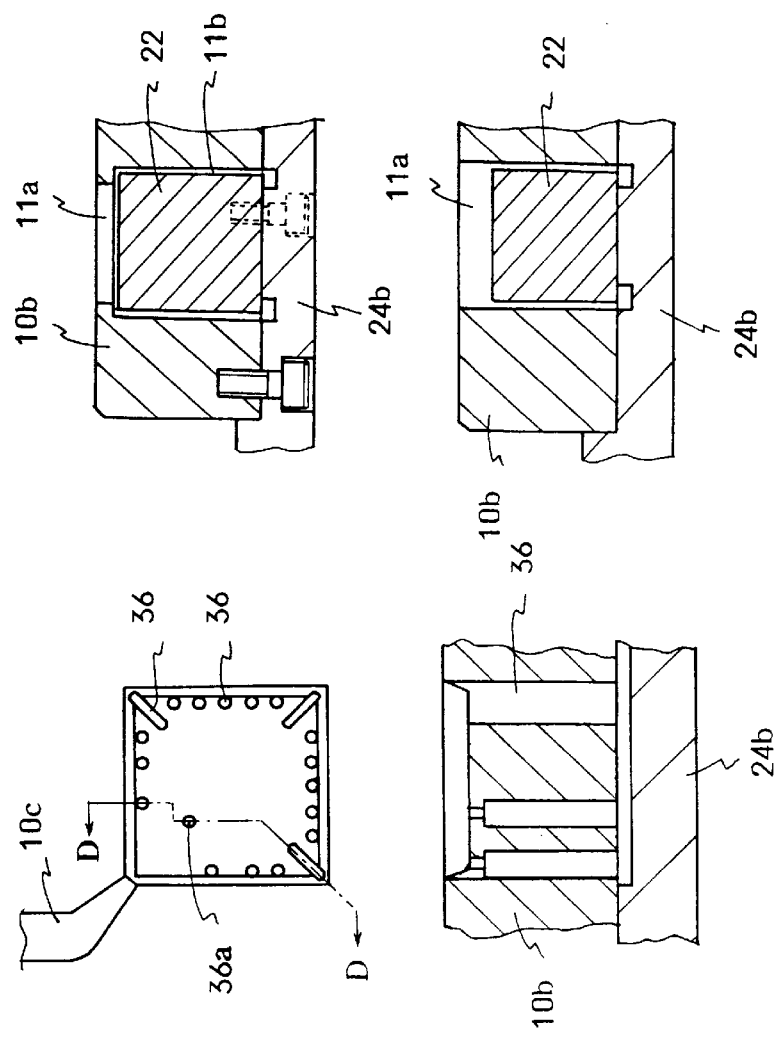
FIG. 19A is a sectional view showing a method of assembling the cavity piece.
FIG. 19B is a sectional view showing a method of assembling the cavity piece.
FIG. 21A is a plan view showing an integrated type molding die.
FIG. 21B is a sectional view showing the integrated type molding die.

Other manners of assembling the cavity pieces 22 in the base sections of the molding dies are shown in FIGS. 19A, 19B and 20. In FIG. 19A, an area of an upper end face of the cavity piece 22 is broader than area of a cavity hole 11a. The cavity piece 22 is inserted in the through-hole 11b for assembling the cavity piece 22. There is formed a gap for sucking air from the bottom of the cavity between the cavity piece 22 arid the through-hole 11b. The cavity hole 11a and the through-hole 11b are bored in the base section of the molding die 10b.

in FIG. 19B, the cavity hole 11a and the through-hole 11b are integrated to form into one hole. The block shaped cavity piece 22 is inserted in the through-hole 11b. As well as the example of FIG. 19A, no draft angle is formed in the side faces of the cavity, so that it is easier to make the molding dies. Of course, the draft angle may be formed in the side faces of the cavity. In this example, a thickness of the molded products can be changed by changing a thickness of the cavity piece 22.

In FIG. 20, the base section of the molding die has two parts: a first part for forming the cavity; and a second part for inserting the cavity piece 22. The base section 10d or the first part has the depth equal to the depth of the cavity. The cavity piece 22 is inserted in the base section 10e or the second part. There is bored the cavity hole 11a for forming the cavity in the base section 10d; there is bored the through-hole 11b for inserting the cavity piece 22 in the base section 10e. With this structure, the base sections 10d and 10e can be made easily. Further, by employing the first part 10d and the second part 10e, the cavity can be formed without the cavity piece 22.

In the present embodiment, the cavity and the cavity air path 36 are formed by assembling the cavity piece 22 in the base section of the die. But they can be formed without the cavity piece 22. This example is shown in FIGS. 21A and 21B. FIG. 21A is a plan view in which the opening sections of the cavity air path 36 are diagonally opened toward the center of the cavity like slits. And a plurality of circular opening sections of the cavity air path 36 are arranged in the bottom face of the cavity along the edges thereof. FIG. 21B is a sectional view taken along the line D—D. In this example too, no opening section of the cavity air path 36 are provided in the vicinity of the corner of the cavity to which the inner end of the gate 10c is connected; the opening sections are separated away from the corner, so that the resin can be properly filled in the cavity as well as the example shown in FIGS. 15A and 15B.

Figure 22:
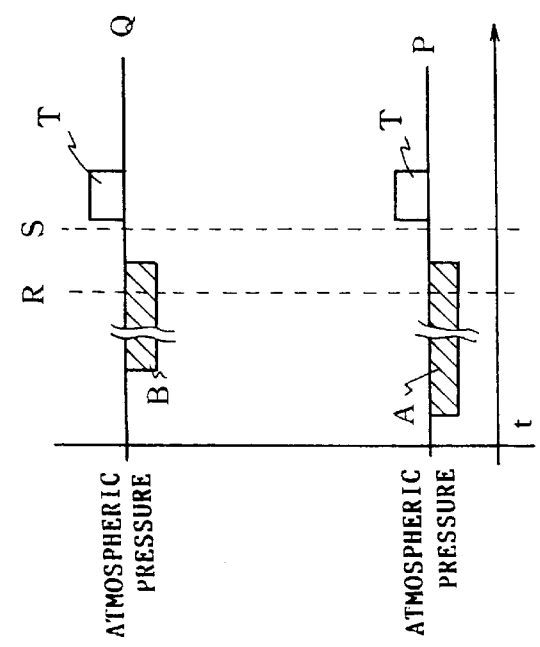
FIG. 22 is a graph showing action of the release film.

Sucking and fixing the release film 30 is shown in FIG. 22. The graph P shows action of the air sucking mechanism A for sucking air to fix the release film 30 on the faces of the dies; the graph Q shows action of the air sucking mechanism B for sucking air to fix the release film 30 on the inner faces of the cavity. Firstly, the release film 30 is sucked and fixed on the faces of the die by the air sucking mechanism A, slightly after then the air sucking mechanism B sucks the release film 30 to fix in the cavity. After the release film 30 is completely fixed on the die, the resin melt is started to fill the cavity. A point R indicates completing filling of the resin; a point S indicates completing solidification of the resin. The air suction is stopped slightly before the point S.

After the molding, the molding dies are opened, then the molded products are ejected from the dies together with the release film 30. If the air sucking mechanisms A and B blow air, the products can be ejected easier. A part T in FIG. 22 indicates the action of blowing air.

By employing the release film 30, the resin molding machine of the present embodiment has the following effects. Since no ejector pins are required, the structure of the molding dies can be simpler. Materials which are not hard can be employed for making the molding dies. Since flow resistance of the resin can be reduced, the resin paths can be thinner. Since polishing the resin paths is not required, it is easier to make the molding dies. Since the molding dies can be made by assembling parts members in the base section, changing a degree of surface roughness and marking can be easily executed by only changing the parts members. Heat treatment, precise surface treatment and plating can be omitted for making the molding dies. Since the resin is not stuck on the molding dies, removing flashes and cleaning are not required. Further, no chemical agents for easily peeling the resin off from the dies are required to mix with the resin.

In the above described examples, the release film 30 is fixed on the molding sections of the molding dies by sucking air through the cavity air paths 36. Further, the cavities may be made of a porous metal instead of forming the cavity air paths 36. In this case, air is sucked through the porous metal sections to fix the release film 30. Even if the molding sections are made of the porous material, the molding sections are covered with the release film 30, so that no problem occurs.

The release film 30 is capable of easily peeling off from the molding dies and the molded products. If the release film 30 is made of porous film having fine holes with diameter of about 20 $\mu$m or film in which fine holes with diameter of about 20 $\mu$m are bored by laser, etc., the molding method has following effects. By using the porous release film, air in the cavities and gas generated from the resin can be discharged through the fine holes without passing the resin. Air ventilation can be executed more effectively through the fine holes than through the air vents, so that high quality molding can be executed.

Figure 23:
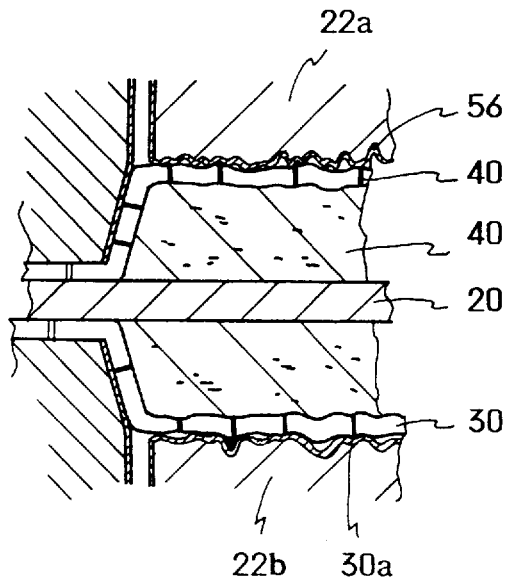
FIG. 23 is an explanation view showing a resin molding method using the release film having fine holes.

A state of leaking the resin from the fine holes 30a of the release film 30 is shown in FIG. 23. While molding, not only air and but also the resin melt are discharged via the fine holes 30a. To prevent the leakage, a treatment for easily peeling off, e.g., applying fluoric resin, may be treated on the faces of the molding dies. The resin leaked out from the fine holes 30a solidify on the both faces of the release film 30, so that the resin solidified can be peeled from the faces of the dies, which have been treated. The resin solidified is discharged from the dies together with the release film 30, so that the dies can be maintained clean. The fluoric resin layer 56 is shown in FIG. 23. Note that, the surface treatment of the molding dies, e.g., forming the fluoric resin layer 56, may be treated in the case of using the release film 30 having no fine holes so as to deal with the resin leakage.

In the present embodiment, by using the release film 30, the materials having high heat conductivity, e.g., copper, aluminum, can be used for the molding dies, so that the heat exchange between the resin and the dies can be accelerated. Thus, resin can be solidified in a shorter time, and the molding cycle time can be shortened. Examples of the high heat conductivity materials and their heat conductivity are as follows: Ni—Cr alloy (k)=37 $W \cdot m^{-1} \cdot K^{-1}$(180° C.); 18–8 stainless steel (k)=18 $W \cdot m^{-1} \cdot K^{-1}$(180° C.); carbon steel (k)=47 $W \cdot m^{-1} \cdot K^{-1}$(180° C.); Fe (k)=65 $W \cdot m^{-1} \cdot K^{-1}$(180° C.); Cu (k)=385 $W \cdot m^{-1} \cdot K^{-1}$(180° C.), etc.

The molding dies have the heaters 23 and they can be made of many kinds of materials, so that it is easier for the molding machine of the present embodiment to precisely control the temperature of the dies than the conventional machines. Further, solidification time of the resin, filling-ability of the resin into the cavities, and the solidification process of the resin therein can be improved.

Figure 24:
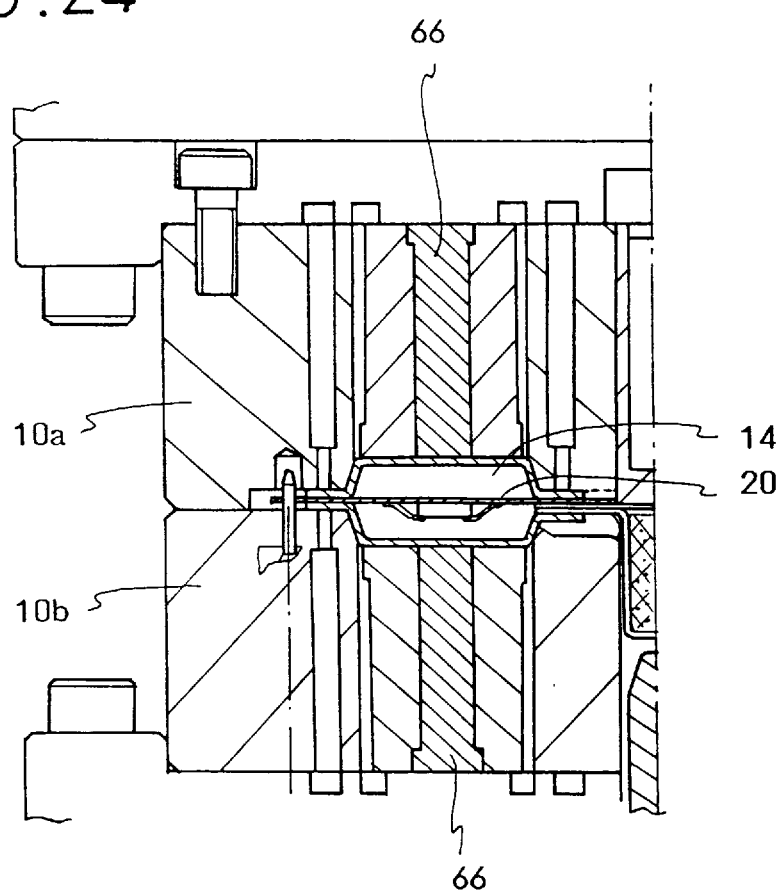
FIG. 24 is a sectional view of the molding dies in which members, whose heat conductivity is different from that of the molding dies, are assembled.

For example, in the case that the solidification process in the upper die 10a and the lower die 10b are different, the filling-ability of the resin into the cavities can be improved. In FIG. 24, since a semiconductor chip is set in the cavity 14 of the lower die 10b, the resin solidification time in the lower die 10b is designed longer than that in the upper die 10a so as to easily fill the resin in the lower die 10b. Thus, the temperature of the lower die 10b is lower than that of the upper die 10a. The heat conductivity of members 66 are different from each other.

The above described heat control is effective in the cases of: molding thin products wherein the filling-ability of the resin into the cavities is an important factor; products whose thickness is partly different; products having heat sinks. Not only by controlling the temperature of the heaters 23 but also by employing different materials, whose heat conductivity are mutually different, for the upper die 10a and the lower die 10b, the temperature of the upper die 10a and the lower die 10b can be different.

When the gates of the molding dies are made of a material whose heat conductivity is lower than that of the cavities, the filling-ability of the resin into the cavities can be improved. By braking the solidification of the resin in the gates, the resin can be filled into the cavities easier. If the gates are heat-insulated from the other parts of the molding dies, the temperature of the gates can be lower than that of the other parts, so that the filling-ability of the resin into the cavities can be improved. Further, if the resin paths for introducing the resin into the cavities are made of materials whose heat conductivity is different from other parts of the dies, flowability of the resin in the resin paths is also improved.

In the case of employing the materials having high heat conductivity for center parts of the cavities, the resin solidification in the center area of the cavities can be accelerated, so that curvature of molded parts of products during and after solidification can be prevented. The materials having different heat conductivity may be arranged on other portions of the cavities. And a plurality of the materials may be arranged in one cavity. Furthermore, the temperature of the molding die can be partially different by controlling the heaters.

Figure 25:
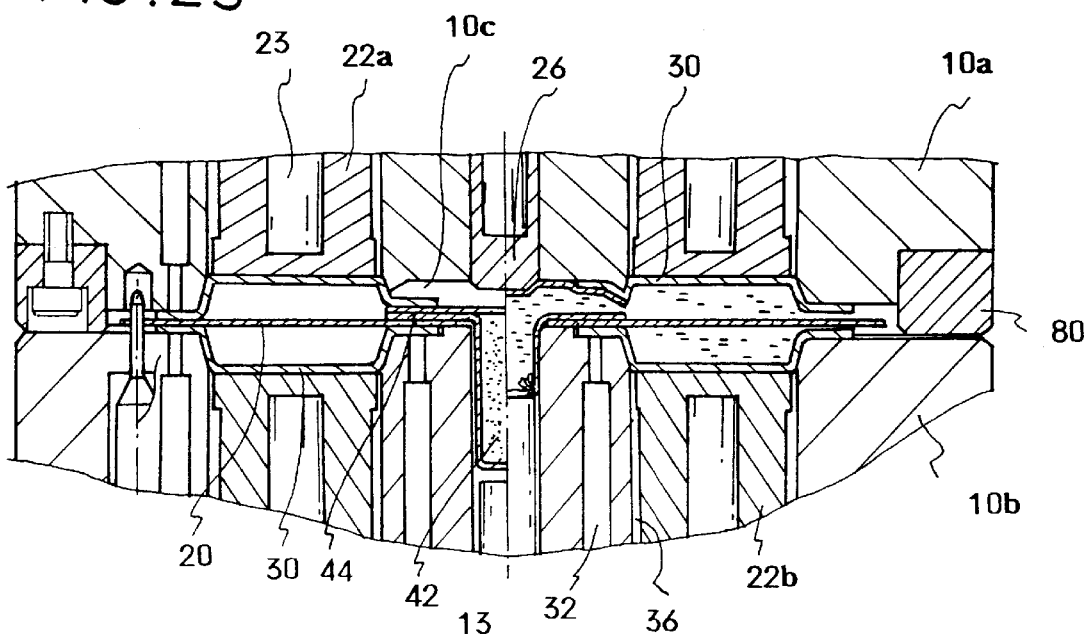
FIG. 25 is a sectional view of the molding machine in which gates are provided in the upper die.

In the present embodiment, the gates 10c are provided in the lower die 10b. They may be provided in the upper die 10a as shown in FIG. 25. By providing the gates 10c in the upper die 10a, the wrapping film 44 of the wrapped resin 42 is mounted on the lead frame 20. Other structures are the same as the example shown in FIG. 3.

Figure 26:
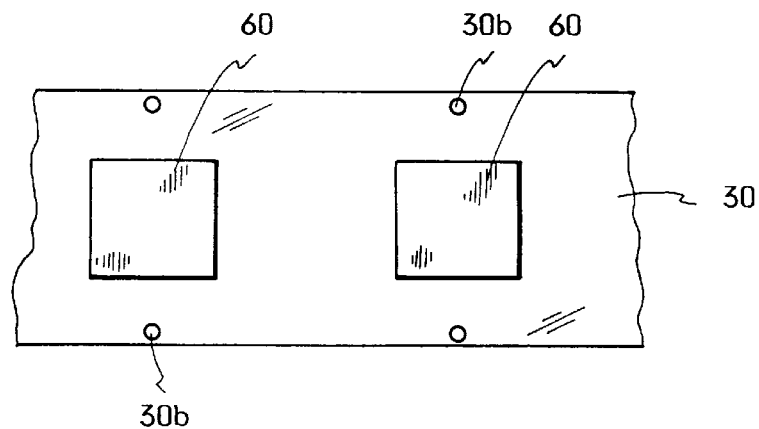
FIG. 26 is a plan view of the release film having a transferring layer.

In the above described examples, the release film 30 is a mere sheet of film without any additional members. Another release film for the molding machines is shown in FIG. 26. The release film 30 has a transferring layer 60 on the film surface. The transferring layer 60 can be transferred and fixed onto a surface of the solidified resin. An aluminum heat sink, thin metal film, etc. can be employed as the transferring layer members. The transferring layer 60 may be formed so as to transfer letters, patterns, etc. onto the surface of the molded products. The transferring layer 60 has been previously adhered on a film material of the release film 30 with an adhesive. The adhesive is capable of resisting the molding temperature of the molding dies, and the adhesive force must be greater than flow-force of the resin filled into the cavities so as not to deform the transferring layer 60 and not to move the position of the layer 60.

Figure 27:
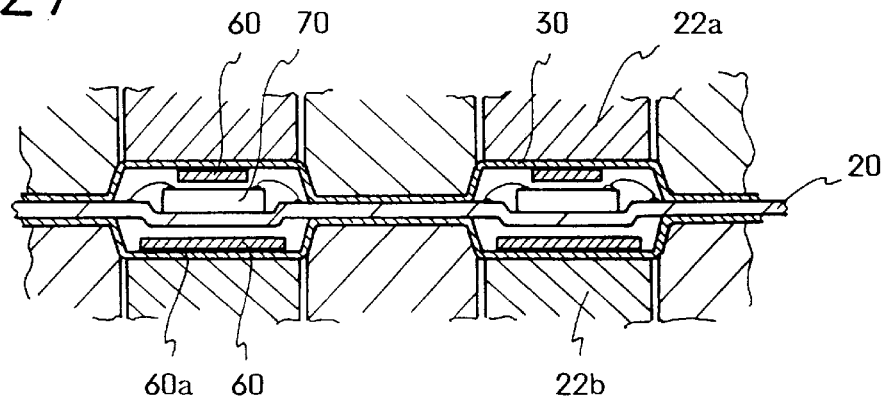
FIG. 27 is a sectional view showing a molding method using the release film having the transferring layer.

A state of sucking the release fi.lm 30 to fix on the molding dies and clamping the lead frame 20 is shown in FIG. 27. The transferring layers 60 are adhered on a cavity side of each release film 30 with the adhesive 60a. In FIG. 27, both release films 30 have the transferring layers 60. In the upper release film 30, the transferring layer 60 is provided to correspond to semiconductor chips 70; in the lower release film 30, the transferring layer 60 is provided to cover over the bottom faces of the cavities. The transferring layers 60 are transferred and fixed onto the molded packages by the adhesive force of the thermosetting resin solidifying.

By providing the transferring layer 60 on the release film 30, the heat sink, the metal film, the patterns, etc. can be simultaneously provided to the molded package during molding. In the conventional molding machine, the heat sink, for example, is molded together with a semiconductor chip, to be exposed from the resin package. By this conventional method, the resin invades into a thin space between the heat sink and the face of the molding die, so that a thin flash is formed therein; by transferring the heat sink as the transferring layer 60, forming the thin flash can be prevented.

Optional patterns can be employed as the transferring layer 60. The patterns in the transferring layer 60 must be formed considering positions of the members to be molded, so that the transferring layer 60 must be precisely positioned on the molding dies. To precisely position the transferring layers 60, feeding holes 30b may be bored in the side edge sections of the release film 30 as shown in FIG. 26. A pitch between the feeding holes 30b is equal to that of the cavities. The feeding holes 30b are formed in one or both side edge sections of the release film 30.

When the heat sink is fixed by the transferring method with the release film having the fine holes, forming voids in the vicinity of the heat sink can be effectively prevented because air is discharged via the fine holes even if air is concentrated in the vicinity of the heat sink.

A condition on the surface of the molding dies can be copied on the surface of the molded products. For example, in the case of forming the surface of the products into a rough surface, the surface of the molding die is formed into a rough surface; in the case of forming the surface of the products into a smooth surface, the surface of the molding die is formed into a smooth surface. Further, in the case of forming a mark on the surface of the products, the mark is formed on the surface of the molding die.

Figure 28:
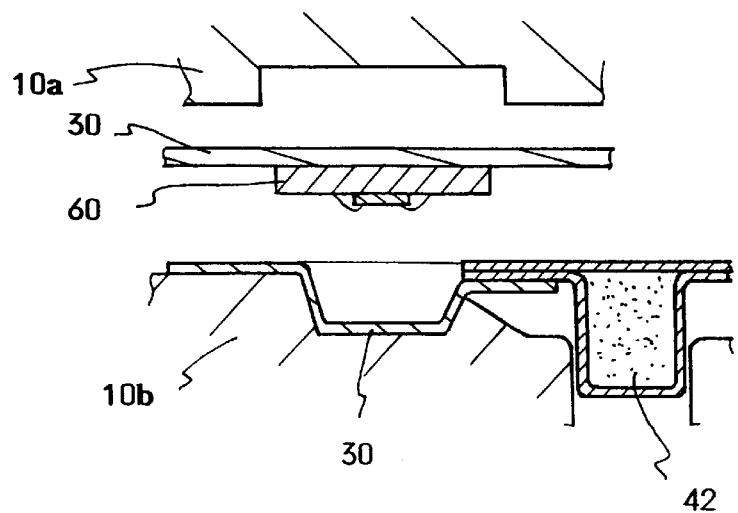
FIG. 28 is a sectional view showing a molding method using BGA as the transferring layer.

In FIG. 28, a BGA substrate 60 is employed as the transferring layer. The release film 30 on which the BGA substrate 60 has been adhered is clamped by the upper die 10a and the lower die 10b to mold. With this structure, a semiconductor device in which one side of the BGA substrate 60 is molded together with a semiconductor chip can be manufactured. The BGA substrate 60 may be left from the release film 30 while molding; the BGA substrate 60 may be discharged together with the release film 30 and left from the release film 30 in the next manufacturing step. This method has an advantage of conveying the BCA substrates 60 together with the release film 30.

Stopper blocks 80 are shown in FIG. 1. The stopper blocks 80 are capable of adjusting a gap between the clamping faces of the molding dies 10a and 10b when the dies 10a and 10b are in a state of clamping. The stopper blocks 80 are fixed on the upper die 10a or the lower die 10b. They are capable of contacting the clamping face of the opposite die to adjust the gap between the clamping faces of the dies 10a and 10b. The stopper blocks 80 are exchangable, so that said gap can be adjusted.

Since the release film 30 has enough softness, the stopper blocks 80 do not damage the release film 30 despite the molding sections and the clamping faces of the molding dies are covered with the release film 30 when they clamp the lead frames 20. And degree of compressing the release film 30 in the state of clamping the lead frames 20 can be adjusted, so that proper molding can be executed.

By adjusting clamping force of the dies by the stopper blocks 80, disuse projections, etc. of the lead frame 20, which are formed in the process of making the lead frame 20, can be absorbed. If the thickness of the release film 30 can be compressed about 25%, the disuse sections of the lead frame 20 can be absorbed in the film 30, so that the lead frame 20 can be molded without forming thin flashes. The clamping force of the molding dies can be reduced to $\frac{1}{5}$–$\frac{1}{4}$ of the conventional ones.

By using the release film 30, distribution of the thickness of the members to be molded, e.g., lead frames, can be absorbed, so that they can be molded properly.

Figure 29:
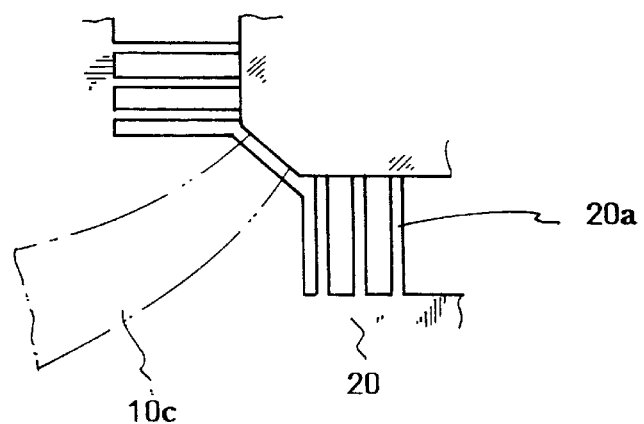
FIG. 29 is an explanation view showing a molding method for a dam-barless lead frame.

By adjusting the gap between the dies 10a and 10b, dam-barless lead frames can be molded. Since the release film 30 can be compressed to about 20% of the initial thickness, the compressed sections act as dam-bars. A state of molding the dam-barless lead frame 20 is shown in FIG. 29. Outer leads are shown with a symbol 20a.

By using the compressible release film 30, the gap between the dies 10a and 10b can be easily adjusted by a die-clamping mechanism, which is driven by a servo motor, etc., without the stopper blocks 80. For example, firstly clamping movement of the die is once stopped about 0.02 mm before a regular clamping position: first compression, then the resin is filled into the cavities. The die is moved again until reaching the regular clamping position while the resin is solidifying: second compression. With this method, shrinkage of the resin while solidifying can be covered by the second compression, so that deformation of the molded portion, e.g., curvature, can be prevented.

[The Structures of The Pot And The Plunger]

As shown in FIG. 1, the sectional shape of the plunger 13 is made thinner toward a front end. By forming the plunger 13 into said shape, piling the wrapping film 44 like bellows can be prevented even if the plunger 13 lifts up the resin, so that the resin paths cannot be closed by the film 44.

Figure 30:
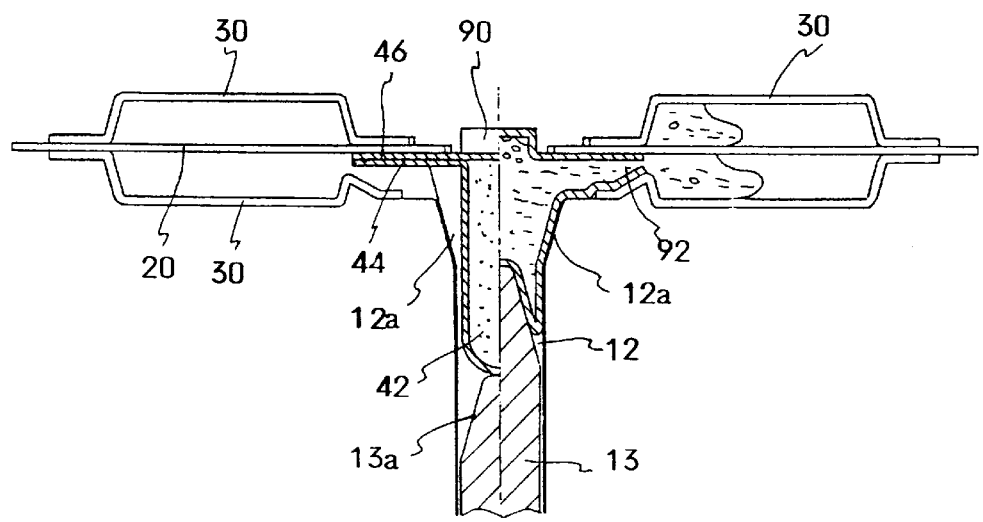
FIG. 30 is a sectional view showing a pot and a plunger.
Figure 31:
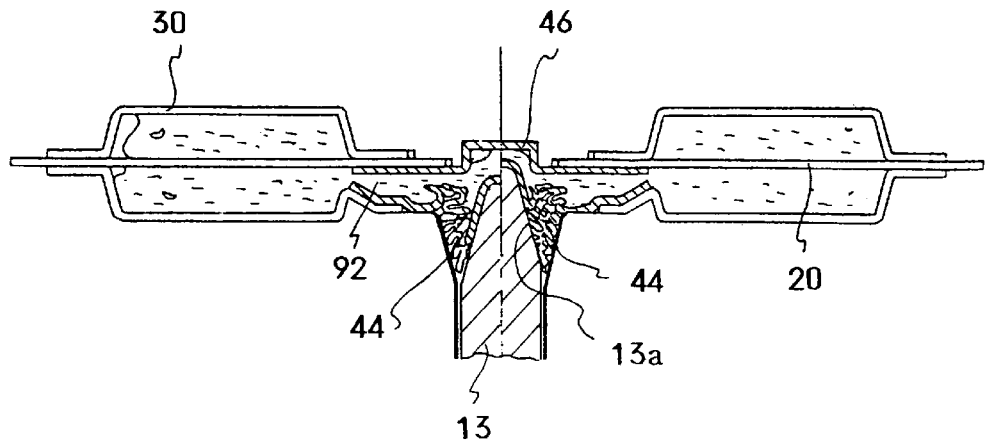
FIG. 31 is a sectional view showing a state of filling the resin into the cavities.

The structure of the pot and the plunger shown in FIGS. 30 and 31 is effective to prevent the resin paths from closing.

An upper part of the pot 12 is formed like a funnel with inclined faces 12a. There is provided an air trap 90 in the cull section of the upper die 10a, which faces the pot 12. The plunger 13 has a tapered section 13a made thinner toward an upper end.

The air trap 90 is capable of trapping air, which is generated from the resin melt in the pot 12. The air trap 90 is faced to the pot 12 and formed into a groove.

The wrapped resin 42 is supplied into the pot 12. A gap between the outer faces of the plunger 13 and the inner faces of the pot 12 is designed to prevent the wrapping film 44 from invading thereinto.

In FIG. 30, the left side of the center line shows a state before filling the resin into the cavities; the right side of the center line shows a state as the plunger 13 begins to lift to fill the resin into the cavities.

Air in the resin melt climbs upward by buoyant force, then becomes trapped in the air trap 90, so that forming air voids in the cavities can be prevented. Resin pressure is applied by the plunger 13, so that the wrapping films 44 and 46 are extended along the inner faces of the gates 10c and the inclined faces 12a of the pot 12, and the resin is filled into the cavities.

In FIG. 31, the left side of the center line shows a state slightly before completely filling the resin into the cavities; the right side of the center line shows a state of completely filling the resin therein. With the lifting of the plunger 13, the wrapping film 44 is gradually loosened, and the loosened section of the film 44 piles on the outer faces of the plunger 13. By forming the tapered section 13a of the plunger 13 and the inclined faces 12a of the pot 12, an accommodating space for accommodating the loosened section of the wrapping film 44 is formed, so that closing the resin paths by the loosened section of the film 44 can be prevented.

Since the wrapping film 44 does not close the resin paths, the plunger 13 is capable of completely filling the cavities with prescribed pressure.

The resin solidified in the pot 12 can be easily removed by merely pushing the resin upward by the plunger 13 because the wrapping film 44 is not caught in the pot 12 and the inclined faces 12a of the pot 12 releases the solidified resin in the pot 12.

In the case that the upper part of the plunger 13 is formed thinner toward the upper end, lifting the wrapping film 44 upward can be prevented but pressurizing the resin cannot be effectively executed. On the other hand, in the case that the upper end face of the plunger 13 is formed flat, pressurizing the resin can be effectively executed but lifting the wrapping film 44 upward cannot be prevented. Considering both conditions, a proper angle of the tapered faces 13a of the plunger 13 with respect to the vertical line is about 45°. Further considering the film piling space and the hardness of the film, a proper angle thereof may be 30°–60° If the angle of the inclined faces 12a of the pot 12 with respect to the vertical line is greater, amount of the resin supplied must be larger, so the proper angle will be small: 1°–15°.

Figure 32:
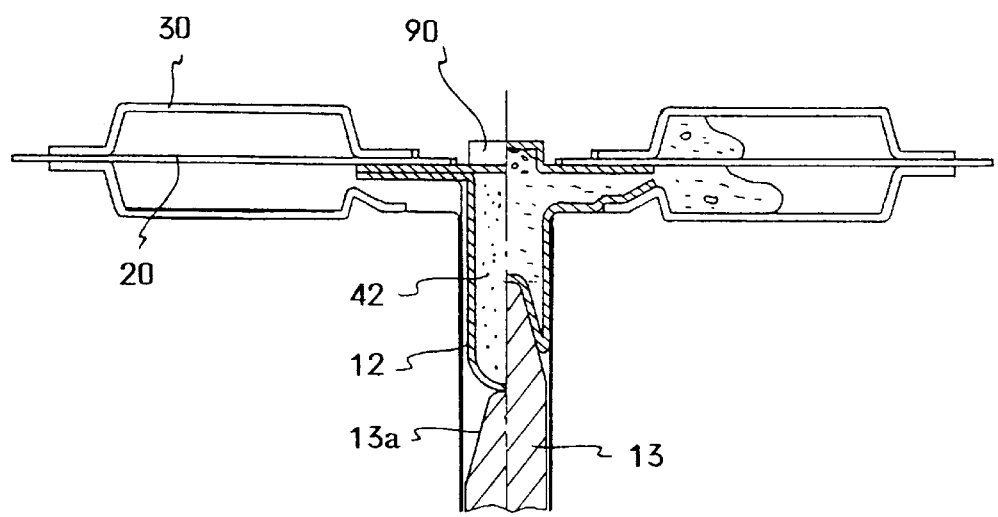
FIG. 32 is a sectional view showing another pot and plunger.
Figure 33:
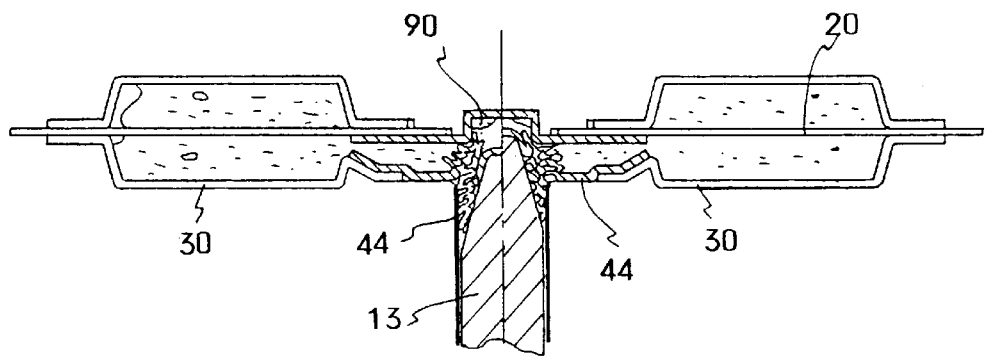
FIG. 33 is a sectional view showing a state of filling the resin into the cavities.

In the examples shown in FIGS. 32 and 33, the pots 12 has no inclined faces 12a. In FIG. 32, the left side of the center line shows a state before beginning to fill the resin; the right side of the center line shows a state after beginning to fill the resin. In FIG. 33, the left side of the center line shows a state slightly before completing the filling of the resin; the right side of the center line shows a state of completing the filling of the resin.

By forming the tapered section 13a of the plunger 13, the invasion of the wrapping film 44 into the pot 12 can be prevented while sending the resin by the plunger 13. But, without the inclined faces 12a, the wrapping film 44 is apt to tightly pile on the outer side of the plunger 13, so that it will be difficult to discharge the solidified resin from the pot 12.

Note that, in the case of using the flat-end plunger 13 with no tapered section 13a and forming the inclined faces 12a in the pot 12, lifting the wrapping film 44 upward can be properly prevented.

Figure 34:
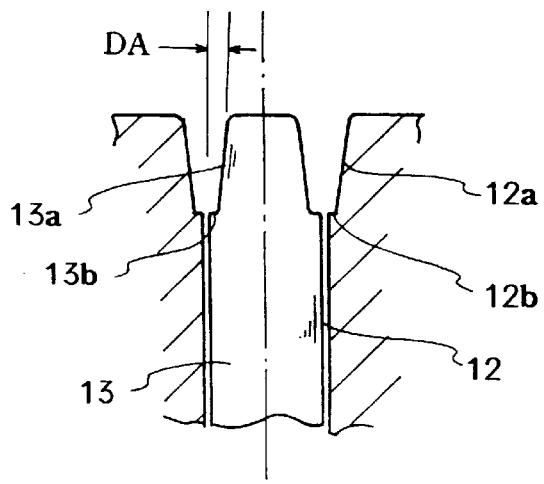
FIG. 34 is a sectional view showing another plunger.

Another structure of the pot and the plunger is shown in FIG. 34. In this example, the tapered faces 13a are formed on both sides of the plunger 13. There are formed step sections 13b in base sections of the tapered faces 13a. The upper end face of the plunger 13 is formed into a flat face. There are formed the inclined faces 12a like a funnel in the pot 12. And there are formed step sections 12b in base sections of the inclined faces 12a. Length DA between the edge of the upper end of the plunger 13 and the base section of the tapered section 13a is designed about twice the size of thickness of the wrapping film 44; the gap between the outer faces of the plunger 13 and the inner faces of the pot 12 is ½ of the thickness of the wrapping film 44. By forming the step section 13b, the space for accommodating the loosened sections of the wrapping film 44 can be formed, and invading the wrapping film 44 into a portion below the step section 13b can be prevented. This structure is effective for the case of using the thinner wrapping film 44 whose thickness is 50 µm or less.

(Second Embodiment)

A one-side resin molding machine with the release film will be explained as Second Embodiment.

Figure 35:
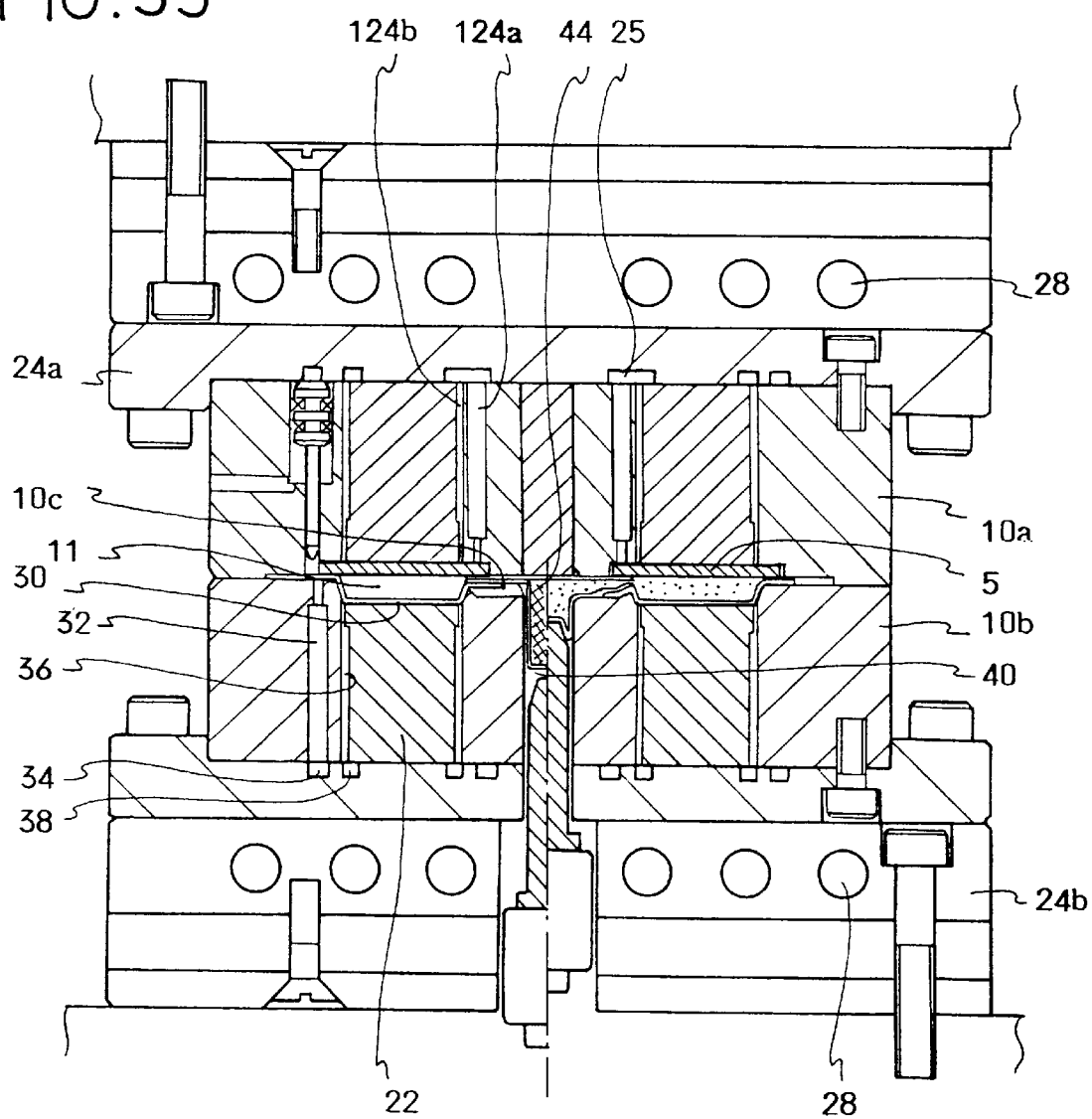
FIG. 35 is a sectional view of a one side molding machine.

In FIG. 35, substrates 5 are held by the upper die 10a; the cavities 11 are formed in the lower die 10b. The left side of the center line shows a state of clamping the substrate 5; the right side of the center line shows a state of filling the resin in the cavity 11.

The release film 40 covers over the cavities 11 of the lower die 10b. The cavity pieces 22 are attached in the lower die 10b. The release film 30 is sucked to fix on the lower die 10b by the manner as in the First Embodiment, so its explanation is omitted.

Figure 36:
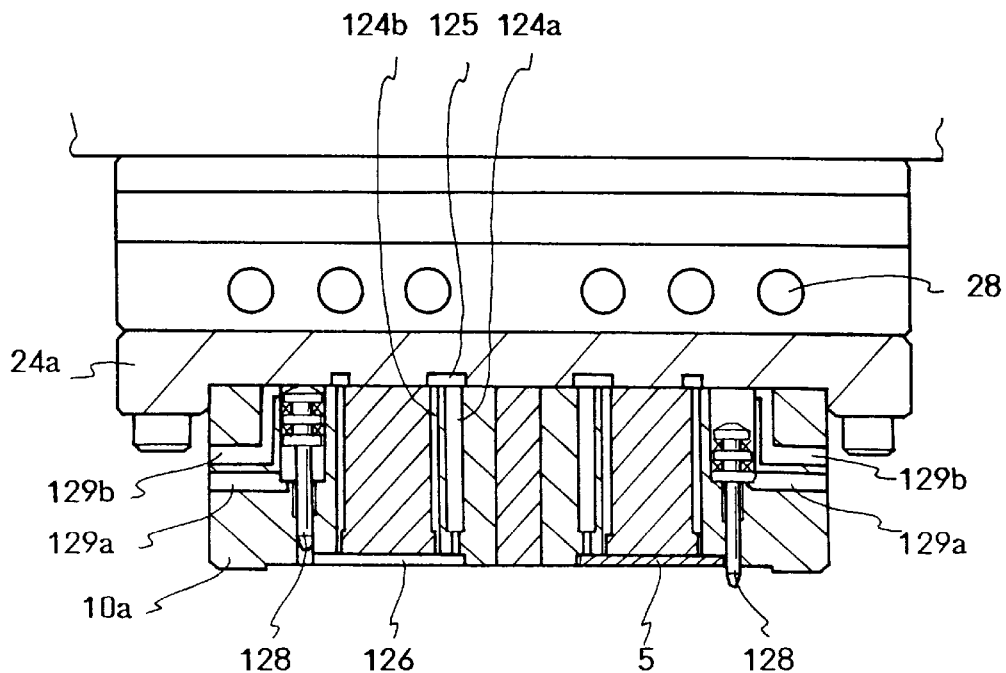
FIG. 36 is a sectional view of an upper die of the one side molding machine.

The substrates 5 are held in the upper die 10a by means for sucking the substrates 5. As shown in FIG. 36, air sucking holes 124a and 124b are formed in the upper die 10a, and they are communicated with an air path 125 in the plate 24a. The air path 125 is connected to an external air sucking mechanism. Pocket sections 126 are formed in the parting face of the upper die 10a, and their depth is equal to the thickness of the substrate 5. The air sucking holes 124a and 124b are opened in bottom faces of the pocket sections 126. Pilot pins 128 are capable of positioning the substrates 5 in the pocket sections 126. Note that, in FIG. 36, the left side of the center line shows a state of not holding the substrate 5; the right side of the center line shows a state of holding the substrate 5.

Figure 37:
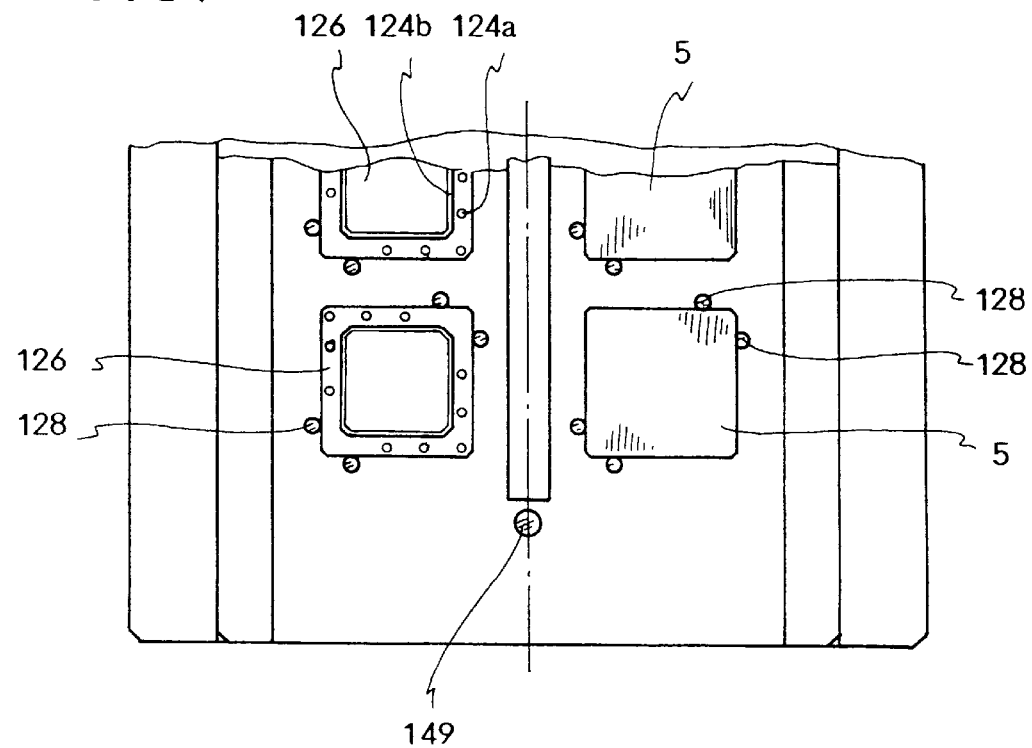
FIG. 37 is an explanation view showing planar arrangement of sucking air paths in the upper die of the one side molding machine.

Planar arrangement of the air sucking holes 124a and 124b, the pilot pins 128, etc. is shown in FIG. 37. in FIG. 37, the left side of the center line shows a state of not holding the substrate 5; the right side of the center line shows a state of holding the substrate 5. A plurality of the air sucking holes 124a are opened in the bottom faces of the pocket sections 126; each air sucking hole 124b is opened like a rectangular slit along the edge of the bottom face of each pocket section 126. Two pilot pins 128 are provided to each couple of diagonal corners of the pocket section 126 so as to contact side faces of two corners of the substrate 5 to position.

The pilot pins 128 are capable of projecting from and retracting into the upper die 10a by an air driving mechanism. Air paths 129*a* and 129*b* are connected to an external air mechanism to drive the pilot pins 128. The pilot pins 128 are driven by charging and discharging compressed air via the air paths 129*a* and 129*b*.

When the substrates 5 are held in the pocket sections 126, the pilot pins 128 are projected from the parting face of the upper die 10*b* so as to contact the side faces of the substrate 5 to position.

Figure 38:
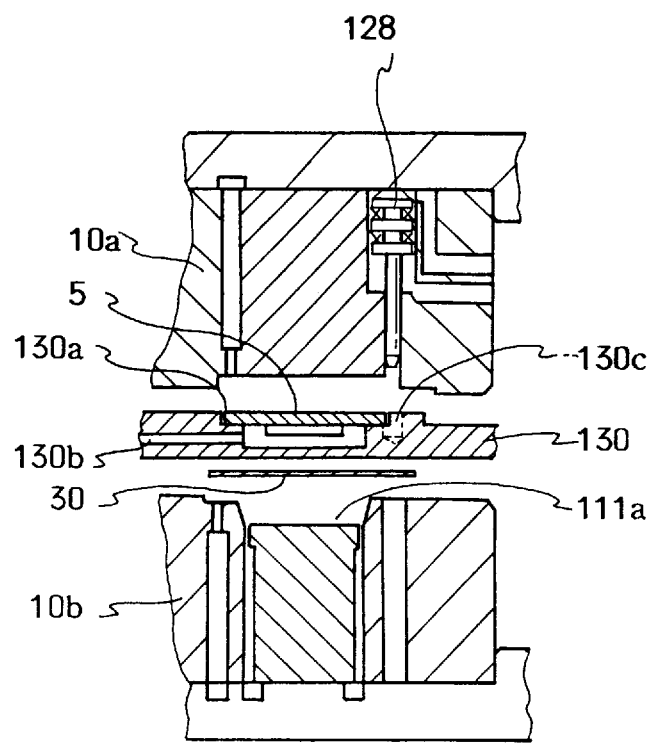
FIG. 38 is an explanation view showing a method of setting a substrate and the release film onto the die.
Figure 39:
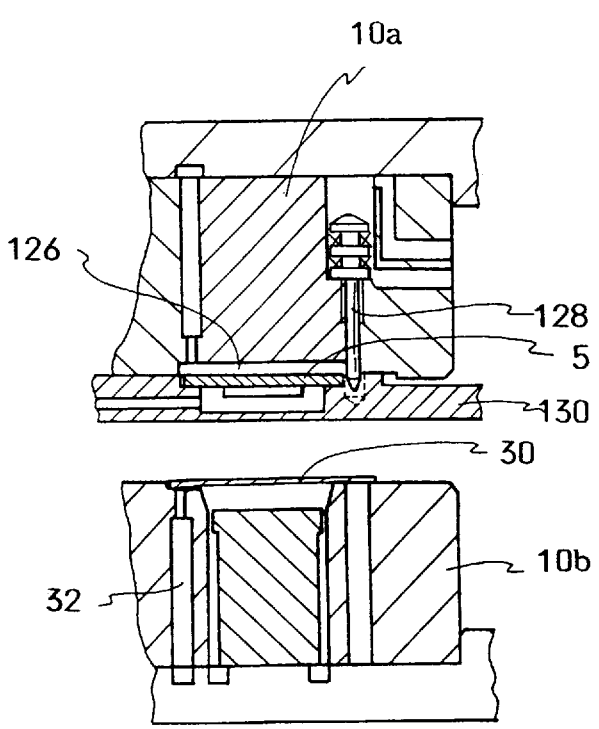
FIG. 39 is an explanation view showing a method of setting the substrate and the release film onto the die.
Figure 40:
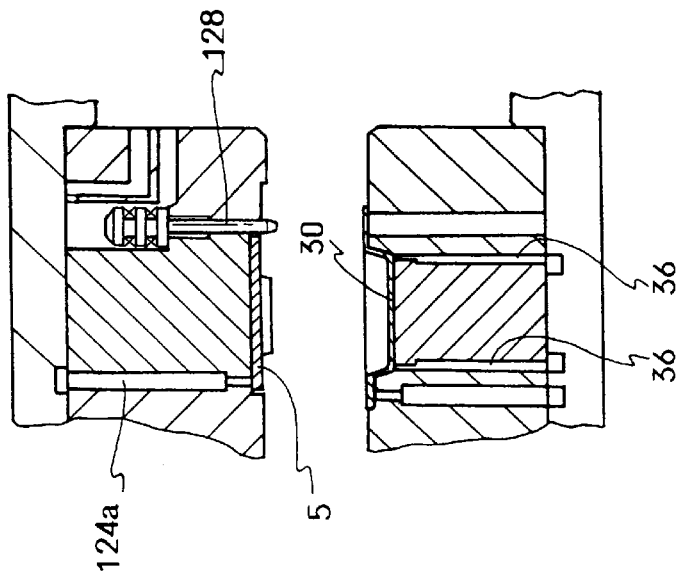
FIG. 40 is an explanation view showing a method of setting the substrate and the release film onto the die.

The step of setting the substrate 5 in the upper die 10*a* to the step of setting the release film 30 on the lower die 10*b* are shown in FIGS. 38–40. In the present embodiment, the substrate 5, which has formed into a piece of board, is set in a conveying jig 130, and the substrate 5 is sent into the molding machine by the jig 130, then the substrate 5 is set in the molding machine.

An opening state of the molding dies 10*a* and 10*b* is shown in FIG. 38. The jig 130 holding the substrate 5 is sent to a position under the parting face of the upper die 10*a*. And the belt like release film 30 is fed on the lower die 10*b*. The jig 130 has a setting section in which the substrate 5 is correctly set, an air path for blowing the substrate 5 upward by air pressure, and a pilot hole 130*c* into which the pilot pin 128, which has been projected, is capable of inserting.

Next, the jig 130 is lifted to move close to the upper die 10*a* as shown in FIG. 39. Then the pilot pin 128 is projected from the parting face of the upper die 10*a* and contacts the side face of the substrate 5 to position the same with respect to the upper die 10*a*.

On the other hand, the release film 30 is sucked by the sucking air path 32, which is formed under the clamping face of the lower die 10*b*. By this sucking, the side edge of the release film 30 is fixed on the lower die 10*b*.

Successively, the substrate 5 is held and positioned in the pocket section 126 of the upper die 10*a* by sucking air through the air sucking holes 124*a* and 124*b*. Note that, by blowing the compressed air from the air path 130*b* of the jig 130, the substrate 5 can be easily held by the upper die 10*a*. FIG. 40 shows a state of moving the jig 130 outside of the dies after the substrate 5 is held by the upper die 10*a*.

On the other hand, the release film 30 is sucked and fixed in the cavity along the inner faces of the cavity by sucking air through cavity air paths 36.

After the substrate 5 and the release film 30 are held in the upper die 10*a* and the lower die 10*b*, the resin is supplied into the pot 12. Then the dies are closed, and the resin is filled into the cavity.

Figure 41:
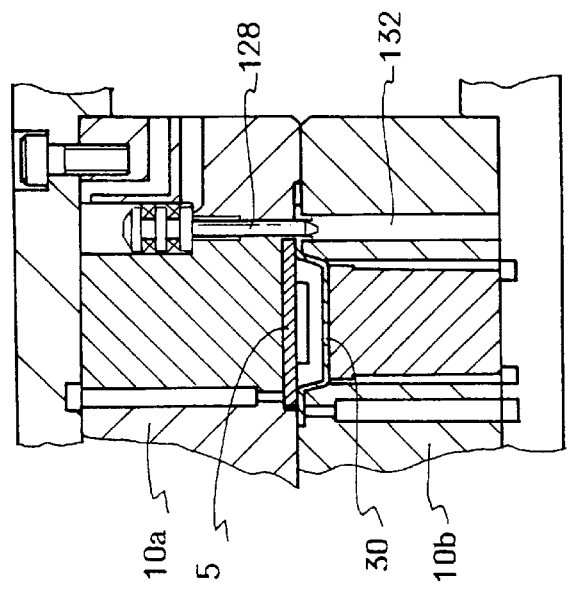
FIG. 41 is a sectional view showing a state of closing the molding dies.

The action of the pilot pin 128 while closing the dies will be explained with reference to FIGS. 41 and 42. In FIG. 41, a pilot hole 132 into which the pilot pin 128 inserts is bored in the lower die 10*b*. When the molding dies 10*a* and 10*b* are closed in a state of projecting the pilot pin 128 from the clamping face of the upper die 10*a*, the pilot pin 128 breaks the release film 30 and goes into the lower die 10*b*.

Figure 42:
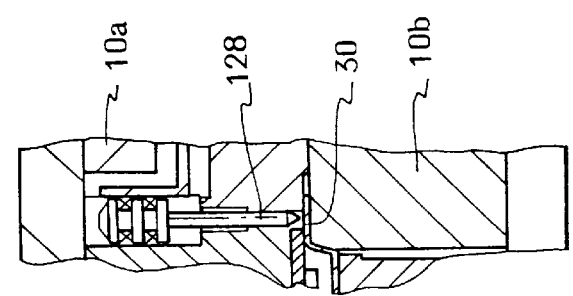
FIG. 42 is a sectional view showing another state of closing the molding dies.

In FIG. 42, there is no pilot hole 132 in the lower die 10*b*. A lower end of the pilot pin 128 contacts the release film 30 on the clamping face of the lower die 10*b*. When the molding dies 10*a* and 10*b* are closed, the pilot pin 128 is retracted into the upper die 10*a*.

In the manner shown in FIG. 41, the subsrate 5 can be more securely and precisely positioned than the manner shown in FIG. 42.

After clamping the substrate 5, the wrapped resin is filled in the cavity to mold. The manner for molding with the wrapped resin is also the same as that of the First Embodiment.

With above described manner, one side of the substrate 5 can be molded with the release film 30. Note that, in the present embodiment, the substrate 5 is held by the upper die 10*a*, but the substrate 5 may be held by the lower die 10*b*, and the gate may be provided in the upper die 10*a*.

Since the inner faces of the molding sections of the molding dies are covered with the release film 30, the release film 30 acts as the dam-bar of the lead frame when the substrate 5 is clamped by the dies 10*a* and 10*b*, so that the substrate 5 can be molded without any protecting treatment, e.g., solder resist. Namely, the release film 30 is compressed by the clamping force of the molding dies, which clamp the substrate 5 together with the release film 30, so that the compressed release film 30 closes gaps between wire patterns, which have been formed on the substrate 5. By this dam-bar function of the compressed release film 30, leakage of the resin from the gaps between the wire patterns can be prevented. When the release film 30 is used as the dam-bar, the clamping force of the molding dies 10*a* and 10*b* is defined on the basis of thickness of the wire patterns, distance between the wire patterns, elasticity of the release film 30, etc.

In the present embodiment, the substrate 5 can be molded without coating solder resist, the resin can be tightly adhered to the substrate 5. Since invading the solder resist into the cavities can be prevented, the quality and the reliability of the molded products can be raised. By clamping the substrate 5 together with the release film 30, the clamping force can be reduced to about ¼ of the conventional manner, so that damaging the release film 30 arid any trouble based on the damaging can be reduced. And by molding with the release film 30, the molded products can be easily ejected from the die together with the release film 30. Further, the release film 30 can be easily peeled off from the resin, so thin products can be molded properly.

Figure 43:
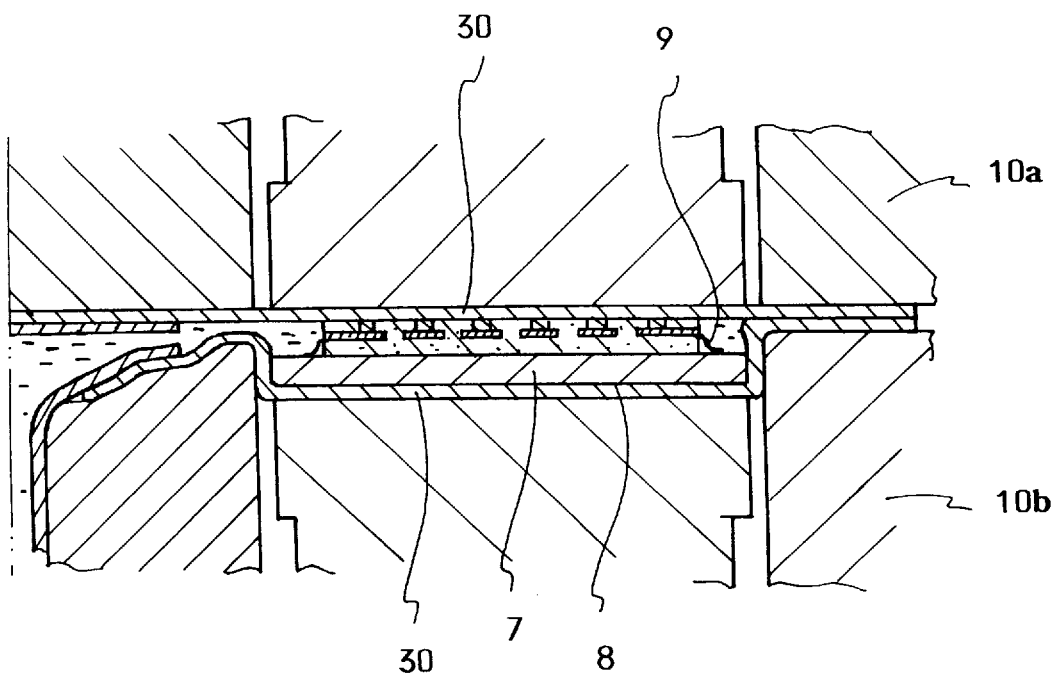
FIG. 43 is a sectional view of a molding machine for chip-size packages.
Figure 44:
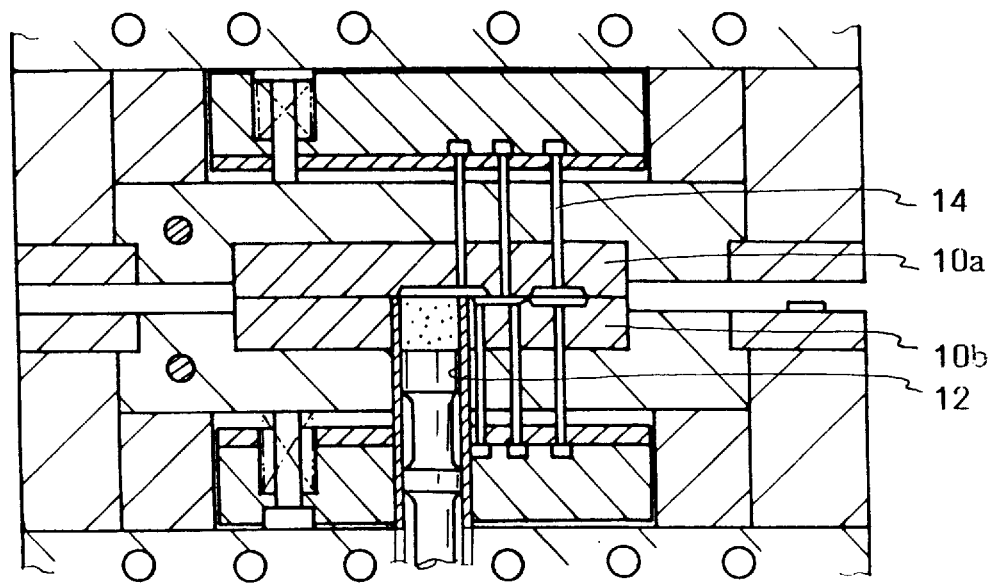
FIG. 44 is a sectional view of the conventional resin molding machine.

A third Embodiment of the resin molding machine with the release film is shown in FIG. 43. It is for molding chip-size packages.

In the present embodiment, the release film 30 is sucked and fixed on the upper die 10*a* and the lower die 10*b*. The semiconductor chip 7 is clamped by the molding dies 10*a* and 10*b* to mold. The lower die 10*b* has a concave section 8 in which the chip 7 is set. A size of the concave section 8, in which the release film 30 is sucked, is about 0.5 mm larger than the chip 7. The clamping face of the upper die 10*a* is formed flat. The chip 7 is clamped by the dies 10*a* and 10*b* together with the release film 30.

A part to be molded is an exposed part, which is an edge section of wire patterns on the chip 7. When the chip-size package is molded with the resin, the chip 7 is clamped by the upper die 10*a* and the lower die 10*b*, simultaneously the chip 7 is pushed for centering in the concave section 8 by a cam mechanism. The resin is filled into the concave section 8 in which the chip 7 has been correctly positioned via the gate 10*c*. By clamping the chip 7 together with the release film 30, invading the resin onto a rear face of the chip 7 and a face to which terminals, e.g., solder balls, are connected can be prevented, so that the quality and the reliability of the chip-size packages can be raised.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A method of forming a semiconductor device by resin molding, said method comprising the steps of:

providing an insert member to be molded upon, a release film, a first die with a first clamping face and a first molding cavity for accepting resin, and a second die with a second clamping face;

providing at least one first opening in the first clamping face and at least one second opening in the first molding cavity, providing an air sucking mechanism, and a plurality of air paths connecting the air sucking mechanism to the at least one first opening and the at least one second opening;

operating the air sucking mechanism;

communicating the air sucking mechanism to the at least one first opening to vacuum the release film against the first clamping face;

subsequently, communicating the air sucking mechanism to the at least one second opening to vacuum the release film into the first molding cavity;

clamping the insert member to be molded upon between the first clamping face and the second clamping face;

delivering fluidized resin into the first molding cavity; and molding upon a portion of the insert member adjacent to the first molding cavity to form the semiconductor device.

2. The method according to claim 1, wherein the air sucking mechanism includes a first air suction device connected to the at least one first opening in the first clamping face, and a second air suction device connected to the at least one second opening in the first molding cavity.

3. The method according to claim 1, wherein the second die includes a second molding cavity, and said step of delivering fluidized resin includes delivering the fluidized resin to the second molding cavity.

4. The method according to claim 1, wherein the at least one first opening includes a plurality of first openings formed in the first clamping face.

5. The method according to claim 1, wherein the at least one second opening includes a plurality of second openings formed in the first molding cavity.

6. The method according to claim 5, wherein the plurality of second openings are located around an inner periphery of the first molding cavity.

7. The method according to claim 1, wherein the at least one second opening is a single continuous opening extending around an inner periphery of the first molding cavity.

8. The method according to claim 1, wherein the at least one second opening is spaced from a corner of an inner periphery of the first molding cavity, nearest to a gate of the first molding cavity through which the fluidized resin in introduced.

9. The method according to claim 1, further comprising the step of operating the air sucking mechanism to blow air from the at least one first opening and the at least one second opening after the semiconductor device is formed.

10. The method according to claim 1, further comprising the step of heating the first die to a first predetermined temperature prior to said step of delivering the fluidized resin.

11. The method according to claim 11, further comprising the step of heating the second die to a second predetermined temperature, different than the first predetermined temperature, prior to said step of delivering the fluidized resin.

12. A method of forming a semiconductor device by resin molding, said method comprising the steps of:

providing a first die having a first clamping face and a first molding cavity; a second die having a second clamping face and a second molding cavity; a pot; a resin path connecting the pot to the first and second molding cavities; an insert member to be molded upon; a first release film; a second release film; an air sucking mechanism; a first plurality of openings formed in the first and second clamping faces; a second plurality of openings formed in the first and second molding cavities; and air sucking paths extending from the air sucking mechanism to the first and second pluralities of openings;

dispensing the first release film onto the first die and dispensing the second release film onto the second die;

operating the air sucking mechanism;

communicating the air sucking mechanism to the first plurality of openings to vacuum the first and second release films against the first and second clamping faces, respectively;

subsequently, communicating the air sucking mechanism to the second plurality of openings to vacuum the first and second release films into the first and second molding cavities, respectively;

clamping the insert member to be molded upon between the first clamping face and the second clamping face;

delivering fluidized resin from the pot, via the resin path, into the first and second molding cavities; and molding upon portions of the insert member adjacent to the first and second molding cavities to form the semiconductor device.

13. The method according to claim 12, wherein the air sucking mechanism includes a first air suction device connected to the first plurality of openings in the first and second clamping faces, and a second air suction device connected to the second plurality of openings in the first and second molding cavities.

14. The method according to claim 12, wherein the second plurality of openings includes a plurality of openings formed in the first molding cavity and a plurality of openings formed in the second molding cavity.

15. The method according to claim 14, wherein openings of the plurality of openings formed in the first molding cavity are located around an inner periphery of the first molding cavity, and openings of the plurality of openings formed in the second molding cavity are located around an inner periphery of the second molding cavity.

16. The method according to claim 12, wherein the plurality of second openings includes a single continuous opening extending around an inner periphery of the first molding cavity, and a single continuous opening extending around an inner periphery of the second molding cavity.

17. The method according to claim 12, wherein at least one of the second plurality of openings is spaced from a corner of an inner periphery of the first molding cavity, nearest to a gate of the first molding cavity through which the fluidized resin in introduced.

18. The method according to claim 12, further comprising the step of operating the air sucking mechanism to blow air from the first and second pluralities of openings after the semiconductor device is formed.

19. The method according to claim 12, further comprising the steps of:

heating the first die to a first predetermined temperature prior to said step of delivering the fluidized resin; and heating the second die to a second predetermined temperature prior to said step of delivering the fluidized resin.

20. The method according to claim 12, further comprising:

removing the semiconductor device from between the first and second dies;

stopping said operating of the air suction mechanism;

removing the first release film from the first die;

removing the second release film from the second die;

re-dispensing a new portion of first release film onto the first die; and re-dispensing a new portion of second release film onto the second die.

* * * * *